(12) United States Patent
Beder et al.

(10) Patent No.: US 7,710,640 B2
(45) Date of Patent: May 4, 2010

(54) PROJECTION OBJECTIVE OF A MICROLITHOGRAPHIC PROJECTION EXPOSURE APPARATUS

(75) Inventors: Susanne Beder, Aalen (DE); Daniel Kraehmer, Essingen (DE); Heiko Feldmann, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 8 days.

(21) Appl. No.: 12/138,851

(22) Filed: Jun. 13, 2008

(65) Prior Publication Data

US 2008/0278799 A1 Nov. 13, 2008

Related U.S. Application Data

(63) Continuation of application No. PCT/EP2006/069406, filed on Dec. 7, 2006.

(60) Provisional application No. 60/753,715, filed on Dec. 23, 2005.

(30) Foreign Application Priority Data

Aug. 16, 2006 (DE) ........................ 10 2006 038 454

(51) Int. Cl.
  *G02B 13/14* (2006.01)
(52) U.S. Cl. ..................... 359/355; 359/362; 359/642
(58) Field of Classification Search .................. None
  See application file for complete search history.

(56) References Cited

U.S. PATENT DOCUMENTS

| 2003/0086157 A1* | 5/2003 | McGuire, Jr. ............... 359/352 |
| 2004/0179272 A1 | 9/2004 | Gerhard et al. |
| 2005/0117224 A1 | 6/2005 | Shafer et al. |
| 2006/0245043 A1* | 11/2006 | Wehrhan et al. ............ 359/350 |

FOREIGN PATENT DOCUMENTS

| WO | WO 2005/059617 | 6/2005 |
| WO | WO 2005/069055 | 7/2005 |
| WO | WO 2006/089919 | 8/2006 |
| WO | WO 2007/031544 | 3/2007 |

* cited by examiner

*Primary Examiner*—Stephone B Allen
*Assistant Examiner*—Derek S Chapel
(74) *Attorney, Agent, or Firm*—Fish & Richardson P.C.

(57) ABSTRACT

A projection objective for a microlithographic projection exposure apparatus. The projection objective can project an image of a mask that can be set in position in an object plane onto a light-sensitive coating layer that can be set in position in an image plane. The projection objective can be designed to operate in an immersion mode, and it can produce at least one intermediate image. The projection objective can include an optical subsystem on the image-plane side which projects the intermediate image into the image plane with an image-plane-side projection ratio having an absolute value of at least 0.3.

24 Claims, 14 Drawing Sheets a)

b)

c)

d)

a)

b)

a)

b)

PROJECTION OBJECTIVE OF A MICROLITHOGRAPHIC PROJECTION EXPOSURE APPARATUS

CROSS-REFERENCE TO RELATED APPLICATIONS

The present application is a continuation of international application PCT/EP2006/069406, filed Dec. 7, 2006, which claims benefit of German Application No. 10 2006 038 454.7, filed Aug. 16, 2006 and U.S. Ser. No. 60/753,715, filed Dec. 23, 2005. The contents of international application PCT/EP2006/069406 are hereby incorporated by reference.

FIELD

The disclosure relates to a projection objective of a microlithographic projection exposure apparatus.

BACKGROUND

Microlithography is used for the manufacture of microstructured components such as for example integrated circuits or liquid crystal displays (LCDs). The microlithography process is performed in a so-called projection exposure apparatus which includes an illumination system and a projection objective. The image of a mask (also called a reticle) which is illuminated via the illumination system is projected via the projection objective onto a substrate (for example a silicon wafer) which is coated with a light-sensitive coating (for example a photoresist) and set up in the image plane of the projection objective, whereby the mask structure is transferred to the light-sensitive coating of the substrate.

In current types of microlithography objectives, in particular immersion objectives with a numerical aperture value (NA) not exceeding 1.0, there is more and more a desire to use materials of a high refractive index, in particular for the last optical element on the image side. In this context, a refractive index is referred to as being high if it exceeds the value for quartz at the given wavelength, i.e., approximately 1.56 at a wavelength of 193 nm. A number of materials are known whose refractive indices at DUV (deep ultraviolet) and VUV (vacuum ultraviolet) wavelengths (<250 nm) are larger than 1.6, for example magnesium spinel ($MgAl_2O_4$), which has a refractive index of approximately 1.87 at 193 nm, or lutetium aluminum garnet ($Lu_3Al_5O_{12}$), which has a refractive index of about 2.14 at 193 nm.

An issue encountered in using these materials as lens materials is that due to their cubic crystallographic structure they exhibit intrinsic birefringence of increasing magnitude the shorter the wavelength. For example in magnesium spinel, measurements have shown a retardation of 52 nm/cm due to intrinsic birefringence, and for lutetium aluminum garnet a retardation of 30.1 nm/cm. The term "retardation" in this context means the difference between the respective optical path lengths for two orthogonal (i.e., mutually perpendicular) states of polarization.

SUMMARY

In some embodiments, the disclosure provides a projection objective for a microlithographic projection exposure apparatus which allows the use of crystal materials with a high refractive index while at the same time limiting the negative influence of intrinsic birefringence.

In certain embodiments, the disclosure provides a projection objective, which is part of a microlithographic projection exposure apparatus, which serves to project an image of a mask that can be set in position in an object plane onto a light-sensitive coating layer that can be set in position in an image plane, and which is designed to operate in an immersion mode, produces at least one intermediate image and includes an optical subsystem on the image-plane side which projects the intermediate image into the image plane with an image-plane-side projection ratio $\beta_i$, wherein the absolute value of the image-plane-side projection ratio $\beta_i$ is at least 0.3.

The term "optical subsystem" as used herein means an arrangement of optical elements with the property that a real object is projected into a real image or intermediate image. In other words each subsystem always includes all optical elements from a specific object plane or intermediate image plane to the next real image or intermediate image.

In certain embodiments, due to the fact that the projection objective has at least one intermediate image and an optical subsystem on the image-plane side which projects the intermediate image into the image plane with an image-plane-side projection ratio $\beta_i$ having an absolute value of at least 0.3, the apparatus in which an intrinsic birefringence caused by a crystalline material of a high refractive index, particularly due to a last lens of high refractive power on the image side, can be efficiently compensated. To perform this compensating function, the projection objective can have one or more compensation lenses in the immediate proximity of the aforementioned intermediate image, wherein the material of the compensation lenses has an intrinsic birefringence of the opposite algebraic sign of the intrinsic birefringence as the lens to be compensated (i.e. for example the last lens on the image-plane side). At the same time, the projection ratio specified according to the disclosure ensures that the objective has a design which allows the ray angles at the location of the compensation lenses to be appropriate for a highly efficient compensation of the intrinsic birefringence.

The disclosure is based, at least in part, on the observation that the relatively large ray angles which occur in the last lens on the image-plane side of a projection objective with a large numerical aperture have the consequence that the ray angles which have to be provided for an effective compensation in the compensation lenses are likewise large.

For an ideal compensation to occur in a ray which passes at a specific angle through the lens that is to be compensated for intrinsic birefringence (for example the last lens), the same ray should pass at the same angle through appropriate compensation lenses (for example lenses with an intrinsic birefringence of opposite algebraic sign) which are of the same cut (e.g. a crystallographic 100-cut), wherein this condition is most important for an effective compensation of intrinsic birefringence at those ray angles for which the intrinsic birefringence is at a maximum. As the intrinsic birefringence for example in a cut of crystallographic 100-orientation has a maximum at a ray angle of 45° relative to the crystallographic coordinate system of the material, it can be of particular importance for an ideal compensation of intrinsic birefringence in an element of high refractive power that the associated compensation lenses (i.e. the lenses which have an intrinsic birefringence of opposite algebraic sign) are likewise traversed under similarly high ray angles.

The disclosure further makes use of the observation that ray angles of such high magnitude can be achieved in particular in an intermediate image, if the projection ratio of the optical subsystem that follows this intermediate image is selected appropriately. Equality between the ray angles in the last intermediate image produced before the image plane and the ray angles in the image plane can be achieved in particular if the condition $$0.8 * NA_{IMI} < NA_{IP} * \frac{n_{IMI}}{n_{LL}} < 1.2 * NA_{IMI} \quad (1)$$

is met, wherein $NA_{IMI}$ represents the numerical aperture at the location of the intermediate image, $NA_{IP}$ represents the numerical aperture on the image side, $n_{IMI}$ represents the refractive index at the location of the intermediate image and $n_{LL}$ represents the refractive index of a last optical element on the image-plane side. In some embodiments, the image-plane-side projection ratio $\beta_i$ is selected so that the foregoing condition (1) is satisfied.

In a case where no optical element is present at the location of the intermediate image, i.e., if $n_{IMI} \approx 1$, the foregoing condition is simplified to $$0.8 * NA_{IMI} < \frac{NA_{IP}}{n_{LL}} < 1.2 * NA_{IMI} \quad (2)$$

Accordingly, with a refractive index of $n_{LL}=2$ for the last optical element on the image-plane side, the following result is obtained for the optimum projection ratio of the last optical subsystem on the image-plane side:

$$\beta_{IP} = \frac{NA_{IMI}}{NA_{IP}} = 0.5 \quad (3)$$

To connect the light path to an immersion medium of a high refractive index, the projection objective optionally has a last optical element on the image-plane side which, at operating wavelength of the projection objective, has a refractive index $n_{LL}$ of at least 1.6 (e.g., larger than 1.7, larger than 2). With the assumption that the last optical element on the image-plane side has a correspondingly high refractive index of $n_{LL} \approx 2$ which is suitable for connecting the light path to an immersion medium of a high refractive index, and with a projection ratio of $\beta_{IP} \approx 0.5$ of the last optical subsystem on the image-plane side, the large ray angles which are used for an optical compensation of the polarization are also present at the location of the intermediate image, so that a good optical compensation of the polarization can be provided by lenses in the proximity of this intermediate image, because rays which pass through the last optical element on the image-plane side can pass at substantially equal angles through the compensation lenses which are arranged in the intermediate image.

In certain embodiments, the projection ratio $\beta_i$ on the image-plane side satisfies the condition $0.3 \leq |\beta_i| \leq 1.2$ (e.g., $0.35 \leq |\beta_i| \leq 1.0$, $0.4 \leq |\beta_i| \leq 0.8$).

According to the disclosure, the compensation can be effected by using substantially concentric meniscus lenses in the area of the intermediate image (i.e., immediately ahead of as well as immediately following the intermediate image). Lenses of this type hardly cause a change of the ray angles, so that the ray angles produced in the intermediate image will essentially also occur in the material of these meniscus lenses (i.e. so that for example a ray angle of 45° in the intermediate image will also in essence not be changed again after it has entered the material of the meniscus lens). In contrast, if a smaller projection ratio had been selected for the last optical subsystem on the image-plane side, one would obtain smaller ray angles in the area of the intermediate image which, in order to produce ray angles of, e.g., 45° in the same material, would involve very strongly curved surfaces and thus involve a more critical design that is less tolerant of manufacturing errors, off-center deviations, etc. If on the other hand a larger projection ratio is chosen for the last optical subsystem on the image-plane side, it is possible to also use lenses other than meniscus lenses in the area of the intermediate image. In this case, positive lenses are suitable with a more strongly refractive surface adjacent to the intermediate image, since the ray angles in the intermediate image are larger than 45° and the rays have to be deflected towards the optical axis.

In some embodiments, the last optical element on the image-plane side is made of lutetium aluminum garnet ($Lu_3Al_5O_{12}$, refractive index about 2.14 at 193 nm). In certain embodiments, the last optical element on the image-plane side is made of yttrium aluminum garnet ($Y_3Al_5O_{12}$), lithium barium fluoride ($LiBaF_3$), or spinel, in particular magnesium spinel ($MgAl_2O_4$).

In some embodiments, a lens that is arranged immediately ahead of the intermediate image and/or a lens that is arranged immediately following the intermediate image is made of a fluoride crystal material, optionally calcium fluoride. This is to make use of the fact that on the one hand calcium fluoride is a suitable compensation partner, e.g., for lutetium aluminum garnet in regard to intrinsic birefringence, and on the other hand, in view of the foregoing background, the placement immediately ahead of or immediately following the intermediate image in the arrangement according to the disclosure is particularly well suited for an effective compensation of intrinsic birefringence.

In some embodiments, the projection objective has at least two crystal lenses whose respective retardations due to intrinsic birefringence are of opposite algebraic sign.

In some embodiments, the projection objective has a next-to-last optical element on the image-plane side which is made of a fluoride crystal material, optionally calcium fluoride ($CaF_2$). This is advantageous insofar as the next-to-last position on the image-plane side is likewise suitable for an effective compensation because the ray angles found there are typically very large, too.

The projection objective in some embodiments has an optical axis, where an angle between a principal ray and the optical axis at the location of the intermediate image is smaller than 10° (e.g., smaller than 7°, smaller than 5°). The term "optical axis" in this context means a straight line or a sequence of straight line segments which passes through the centers of curvature of the optical components that it traverses.

The projection objective in some embodiments has a plurality of lenses made of a fluoride crystal material, optionally calcium fluoride, wherein an angle between a principal ray and the optical axis at the location of at least one of these lenses (e.g., at the locations of all of these lenses) is smaller than 10° (e.g., smaller than 7°, smaller than 5°).

The design configuration with small principal ray angles is advantageous insofar as it has been found that a suitable selection of the principal ray angle is of special importance for the best possible match between the ray angles in the lens that is to be compensated for birefringence and the ray angles in the lenses that serve for the compensation. With a (typically given) telecentricity on the image side, this principal ray runs parallel to the axis in the image plane, so that the principal ray angle is small at the location of the last optical element on the image-plane side. It is therefore advantageous if this principal ray also passes at a small angle through the lenses which are used for the compensation (for example in the proximity of the intermediate image or also at other locations). For example, if concentric meniscus lenses are set up near the intermediate image for the compensation of intrinsic birefringence, the principal ray angles in the material of these lenses will be small.

In some embodiments, at least one (e.g., all) of these lenses are made with a crystallographic cut where the optical axis is substantially parallel to the crystallographic <100>-direction.

In some embodiments, at least one (e.g., all) of these lenses are made with a crystallographic cut where the optical axis is substantially parallel to the crystallographic <111>-direction.

The projection objective in some embodiments has at least one further optical element whose material, geometry and position are chosen so that an optical path difference between an upper and a lower coma ray which exists in the last optical element on the image-plane side is at least partially compensated by the further optical element.

In accordance with a further aspect, the disclosure relates to a projection objective in a microlithographic projection exposure apparatus which serves to project an image of a mask which can be set up in an object plane onto a light-sensitive coating which can be set up in an image plane, wherein the projection objective is designed to operate with immersion, with a last optical element on the image-plane side and at least one further optical element whose material, geometry and position are chosen so that an optical path difference between an upper and a lower coma ray which exists in the last optical element on the image-plane side is at least partially compensated by the further optical element.

In some embodiments, the last optical element on the image-plane side at an operating wavelength of the projection objective has a refractive index $n_{LL}$ of at least 1.6 (e.g., larger than 1.7, larger than 2).

In some embodiments, that last optical element on the image-plane side is made of a material selected from the group that contains lutetium aluminum garnet ($Lu_3Al_5O_{12}$), yttrium aluminum garnet ($Y_3Al_5O_{12}$), lithium barium fluoride ($LiBaF_3$), and spinel, in particular magnesium spinel ($MgAl_2O_4$).

In some embodiments, has at least one lens designed so that this lens and the last optical element on the image-plane side cause respective retardations due to intrinsic birefringence which are of opposite algebraic sign.

In accordance with a further aspect, the disclosure relates to a projection objective of a microlithographic projection exposure apparatus which serves to project an image of a mask which can be set up in an object plane onto a light-sensitive coating which can be set up in an image plane, wherein the projection objective is designed to operate with immersion, wherein the projection objective has an optical axis and produces at least one intermediate image, wherein the projection objective has an image-side numerical aperture $NA_{IP}$ and a last optical element on the image-plane side which at an operating wave-length of the projection objective has a refractive index $n_{LL}$, and wherein at least two lenses of the projection objective are arranged in a position along the optical axis where $v_{max}$, i.e., the sine function of a maximum ray angle relative to the optical axis (OA) satisfies the condition $$v_{max} > 0.9 * \frac{NA_{IP}}{n_{LL}}.$$

In some embodiments, the refractive index $n_{LL}$ of the last optical element on the image-plane side at the operating wavelength is larger than 1.6 (e.g., larger than 1.7, larger than 2).

In some embodiments, at least one of these lenses is made of a fluoride crystal material, optionally of calcium fluoride ($CaF_2$).

In some embodiments, at least one of these lenses is arranged adjacent to the intermediate image.

In some embodiments, at least one of these lenses is arranged adjacent to a waist of the projection objective. This is advantageous insofar as an effective compensation of intrinsic birefringence can take place even in a pronounced waist because of the large ray angles that are likewise occurring there.

A waist, as the term is used herein, means a significantly narrowed-down section of the projection objective with a pronounced local minimum of the cross-sectional diameter of the electromagnetic radiation passing through the projection objective. A "pronounced" local minimum means a location along the optical axis of the projection objective where the diameter of the electromagnetic radiation passing through the projection objective is less than 80% (e.g., less than 60%, less than 40%) in comparison to the bulge lying upstream and the bulge lying downstream of the waist. The term "bulge" means a section of the projection objective where the diameter of the electromagnetic radiation traveling through the projection objective has a local maximum.

In some embodiments, an angle between a principal ray and the optical axis at the location of at least one of these lenses (e.g., at the locations of all of these lenses) is smaller than 10° (e.g., smaller than 7°, smaller than 5°).

In some embodiments, the projection objective has a plurality of lenses of a fluoride crystal material, optionally calcium fluoride ($CaF_2$). A retardation which is caused in these lenses by intrinsic birefringence can be of the opposite algebraic sign of a retardation that is caused by intrinsic birefringence in the last optical element on the image-plane side.

In some embodiments, an aperture ray covers a first path length $d_1$ in these fluoride crystal lenses and a second path length $d_2$ in the last optical element on the image-plane side, where the first and the second path length are selected so that the condition $(0.7*|\Delta_2|*d_2) < (|\Delta_1|*d_1) < (1.3*|\Delta_2|*d_2)$ is satisfied, wherein $\Delta_1$ represents the retardation caused for this ray by birefringence in the fluoride crystal material, and $\Delta_2$ represents the retardation caused for this ray by birefringence in the material of the last optical element on the image-plane side.

In some embodiments, an aperture ray covers a path length in the fluoride crystal lenses that is in essence ten times as long as a path length of this aperture ray in the last optical element on the image-plane side. This is advantageous insofar as the maximum retardation caused by intrinsic birefringence in calcium fluoride is about 3.4 nm/cm at a typical operating wavelength of 193 nm and thus is, e.g., smaller by about an order of magnitude than the maximum retardation due to intrinsic birefringence which occurs in lutetium aluminum garnet, which is about 30.1 nm/cm at 193 nm, and insofar as these two materials with the same crystal orientation and equal ray angles cause retardations of opposite algebraic sign.

In accordance with a further aspect, the disclosure relates to a projection objective of a microlithographic projection exposure apparatus which is designed to operate with immersion and has an image-side numerical aperture of at least 1.0, wherein the projection objective has an optical polarization compensation such that a retardation caused by the projection objective between two orthogonal states of polarization is less than 0.25 times as large as the operating wavelength of the projection objective.

In accordance with a further aspect, the disclosure relates to a projection objective of a microlithographic projection exposure apparatus, wherein the projection objective has at least one lens which due to intrinsic birefringence causes a maximum retardation of at least 25 nm/cm, wherein the projection objective has an optical polarization compensation such that a retardation caused by the projection objective is less than 0.25 times as large as the operating wavelength of the projection objective.

The projection objective can have an image-side numerical aperture of at least 1.0 (e.g., at least 1.2, at least 1.4).

The operating wavelength of the projection objective can be less than 250 nm (e.g., less than 200 nm, less than 160 nm).

In some embodiments, the projection objective is of a purely refractive design.

The projection objective can also be of a catadioptric design and can in particular on the side towards the object plane include a subsystem of a catadioptric design.

The disclosure further relates to a microlithographic projection exposure apparatus, a method for the microlithographic manufacture of micro-structured components, as well as a micro-structured component.

Further developments of the disclosure can be found in the description as well as in the subordinate claims.

BRIEF DESCRIPTION OF THE DRAWINGS

The disclosure will hereinafter be explained in more detail through examples which are illustrated in the attached drawings, wherein.

DETAILED DESCRIPTION

Figure 1:
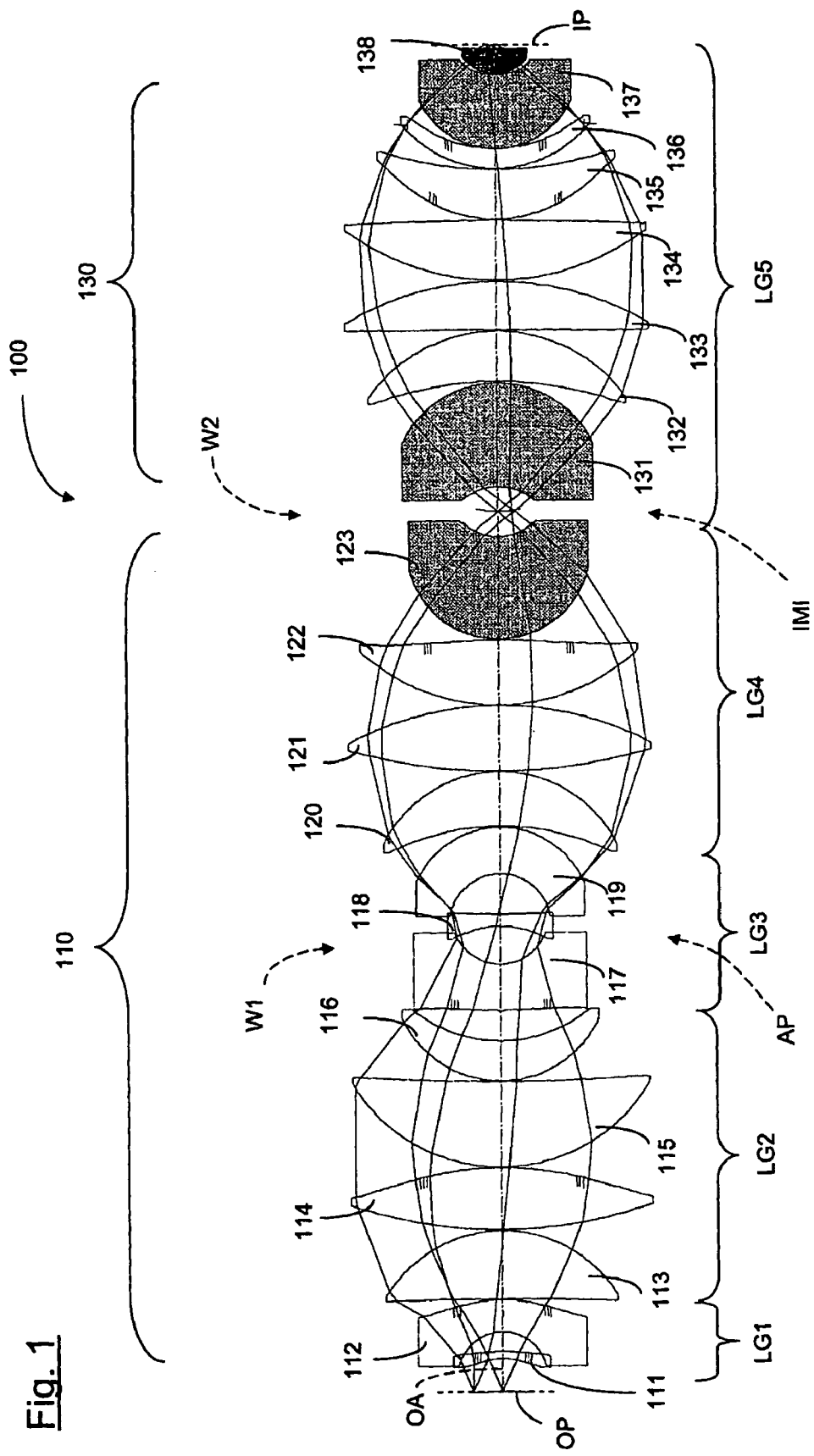
FIG. 1 represents a meridional section of a complete projection objective of a purely refractive design.

FIG. 1 illustrates a projection objective.

The design data of this projection objective 100 are listed in Table 1. Column 1 of the table lists the reference number of each refractive or otherwise specifically distinguished optical surface, column 2 indicates the radius r of the surface (in mm), column 3 indicates the distance (referred to as thickness) of this surface to the next-following surface (in mm), column 4 indicates the material which follows that surface, column 5 lists the refractive index of the material at λ=193 nm, and column 6 indicates the optically usable free half-diameter of the optical component. The term "track length" means the length of the projection objective from the object plane to the image plane.

The surfaces which are marked in FIG. 1 by short horizontal lines and specifically referred to in Table 2 are aspherically curved, wherein the curvature of these surfaces is described by the following formula for aspheres:

$$P(h) = \frac{(1/r)*h^2}{1+\sqrt{1-(1+K)(1/r)^2 h^2}} + C_1 h^4 + C_2 h^6 + \ldots \quad (4)$$

In this formula, P represents the sagittal height of the respective surface parallel to the optical axis, h represents the radial distance from the optical axis, r represents the curvature radius of the respective surface, K represents the conical constant, and C1, C2, . . . represent the aspheric constants listed in Table 2.

According to FIG. 1, the projection objective 100 in a purely refractive design has a first optical subsystem 110 and a second optical subsystem 130.

The first optical subsystem 110 includes, in sequence along the optical axis OA, a first negative lens group LG1 of two lenses 111 and 112, a second positive lens group LG2 of lenses 113-116, and a third negative lens group LG3 of lenses 117 119. The third lens group LG3 contains the first waist W1 of the projection objective 100. AP corresponds to the aperture stop.

The first subsystem 110 includes further along the optical axis OA a fourth positive lens group LG4 of lenses 120-122 as well as a first positive meniscus lens 123, behind which an intermediate image IMI is produced. The intermediate image IMI is projected by the second optical subsystem 130 (with a fifth lens group LG5) into the image plane IP.

The second subsystem 130 includes a second positive meniscus lens 131 which is followed by an arrangement of positive lenses 132-138. Between the two meniscus lenses 123 and 131 there is a second waist W2 of the projection objective 100. The planar-convex lens 138 is the last lens on the image-plane side of the projection objective 100. When the system is operating in immersion mode, the space between the light exit surface of this last lens 138 and the light-sensitive coating which is arranged in the image plane IP is occupied by an immersion liquid (not shown in the drawing), cyclohexane in the present example.

In the projection objective 100 of FIG. 1, the last lens 138 on the image-plane side is made of lutetium aluminum garnet ($Lu_3Al_5O_{12}$) of a crystallographic <100>-cut (i.e., the optical axis runs substantially parallel to the crystallographic <100>-direction or a direction that is equivalent to the crystallographic <100>-direction. The meniscus lenses 123, 131 and 137 are made of calcium fluoride ($CaF_2$), likewise of a crystallographic <100>-cut. The rest of the lenses of the projection objective 100 are made of amorphous quartz ($SiO_2$).

In the design configuration shown in FIG. 1 the entirety of the meniscus lenses made of calcium fluoride ($CaF_2$), i.e. 123, 131 and 137, substantially provides via of polarization optics a compensation of the retardation caused by intrinsic birefringence in the last lens 138 on the image-plane side which is made of lutetium aluminum garnet ($Lu_3Al_5O_{12}$). Table 3 lists for selected rays the respective ray angles at the locations of the three meniscus lenses 123, 131 and 137 that are made of calcium fluoride ($CaF_2$) and at the location of the last lens 138 on the image-plane side, which is made of lutetium aluminum garnet ($Lu_3Al_5O_{12}$) as well as the path lengths inside these lenses. The selected rays in this case consist of a ray that originates from the object field at its point of intersection with the optical axis (identified by the heading YOB=0) and traverses the last lens 138 at an angle of 45°, as well as the two rays that originate from a point at the border of the object field (identified by the heading YOB=28.0) and traverse the last lens 138 at angles of 45° and −45°, respectively, as well as the corresponding values for the principal ray.

Figure 4:
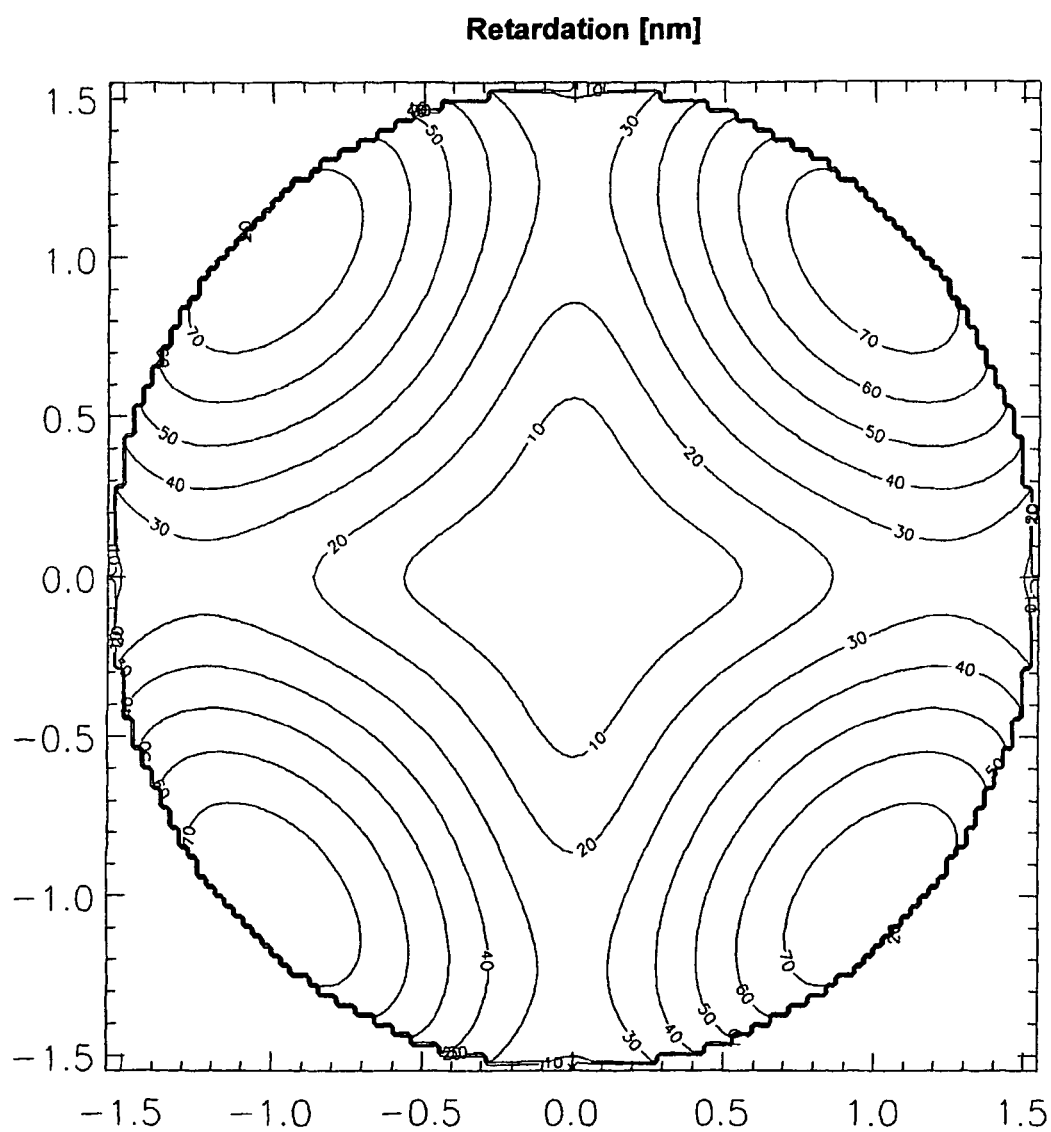
FIGS. 4a-b represent the retardation in the projection objective of FIG. 1 taking the intrinsic birefringence into account only in the last lens on the image-plane side, for a bundle of rays originating from the center of the object field (FIG. 4a) and for a bundle of rays originating from the border of the object field (FIG. 4b)
FIGS. 4c-d represent the resultant retardation in the projection objective of FIG. 1 taking into account the compensation of intrinsic birefringence in accordance with the disclosure, for a bundle of rays originating from the center of the object field (FIG. 4c) and for a bundle of rays originating from the border of the object field (FIG. 4d)
FIG. 4e illustrates a comparison between the respective retardations with and without compensation in a 45°-section.
Figure 4:
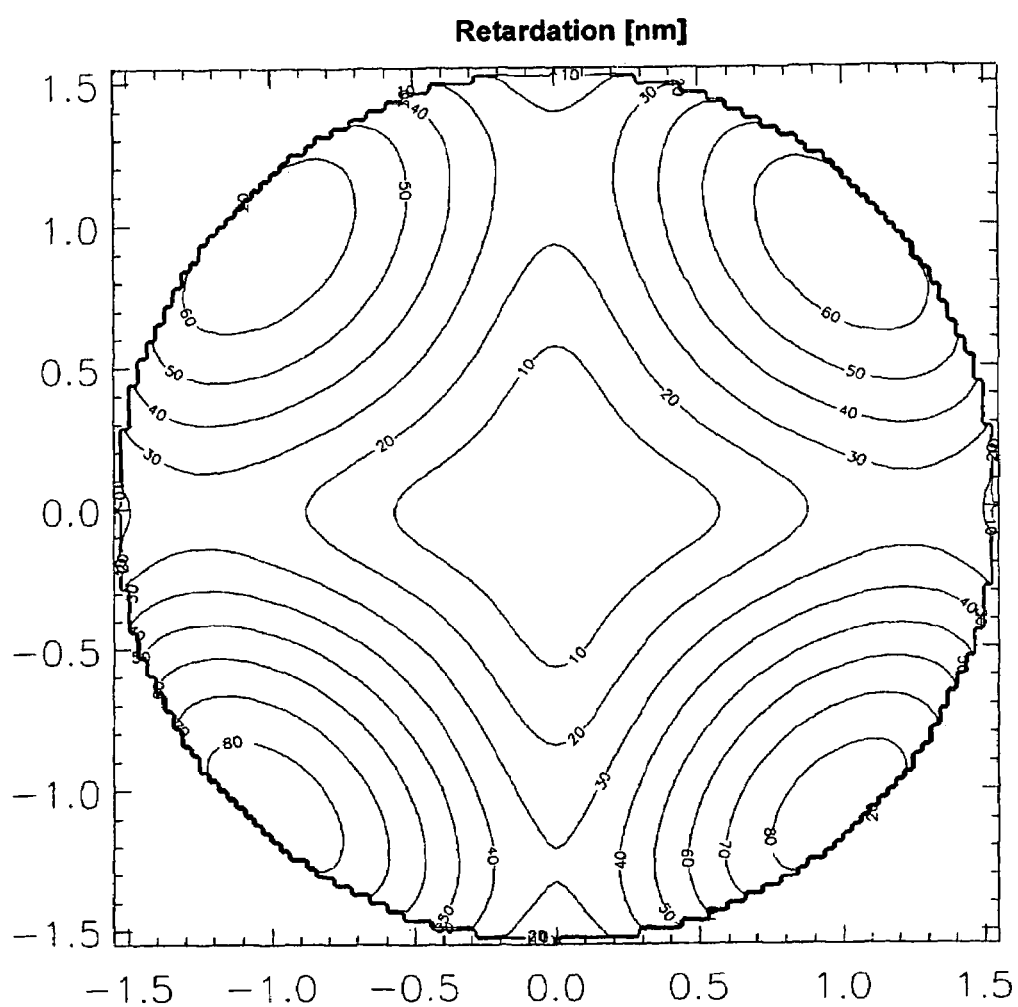
Figure 4:
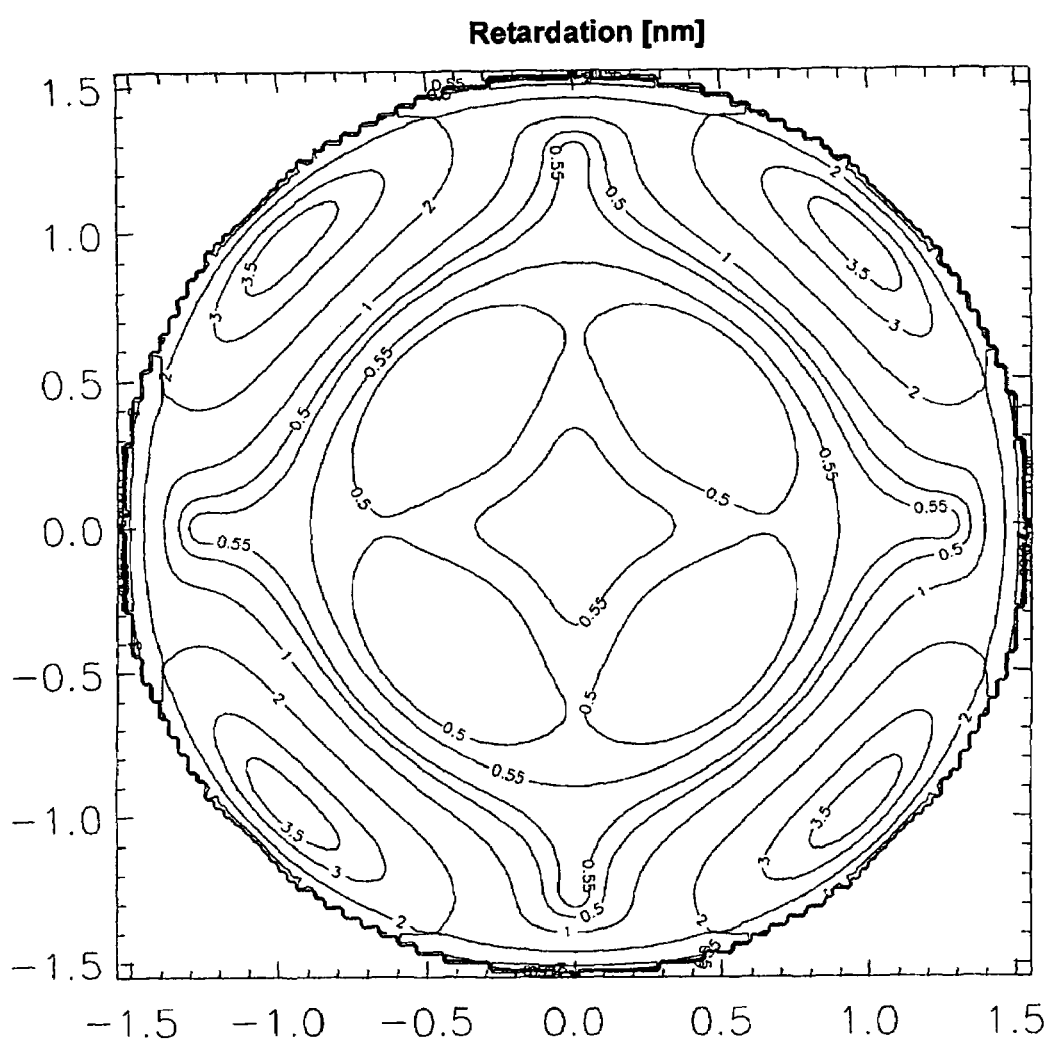
Figure 4:
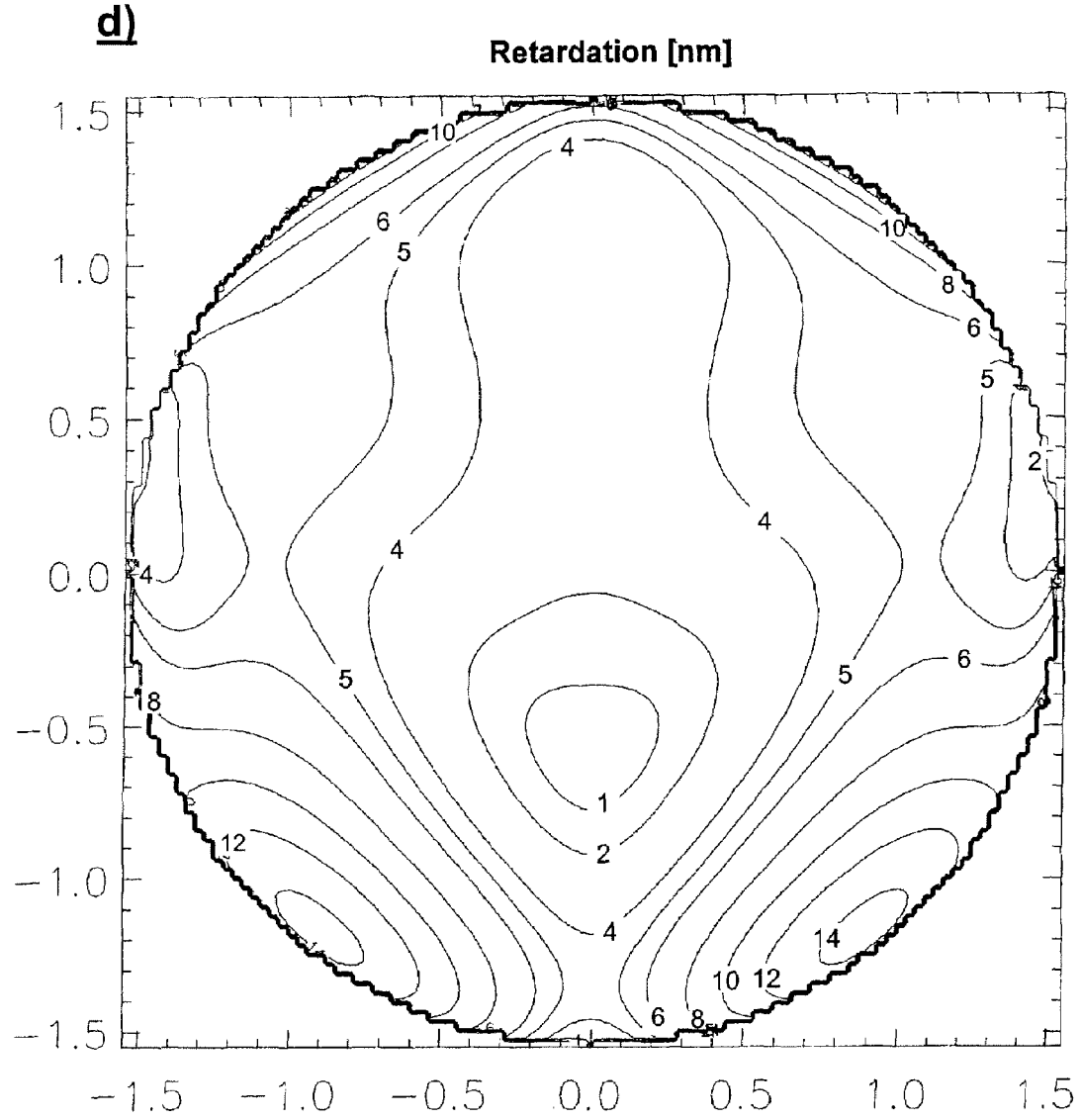

Of particular interest in this case are the rays that pass through the last lens at angles of 45° and −45°, because the retardation due to intrinsic birefringence has maximum values at these ray angles in the last lens 138, as can be seen in FIG. 4a for a ray bundle originating from the center of the object field (YOB=0) and in FIG. 4b for a ray bundle originating from the border of the object field (YOB=28.0).

Figure 5:
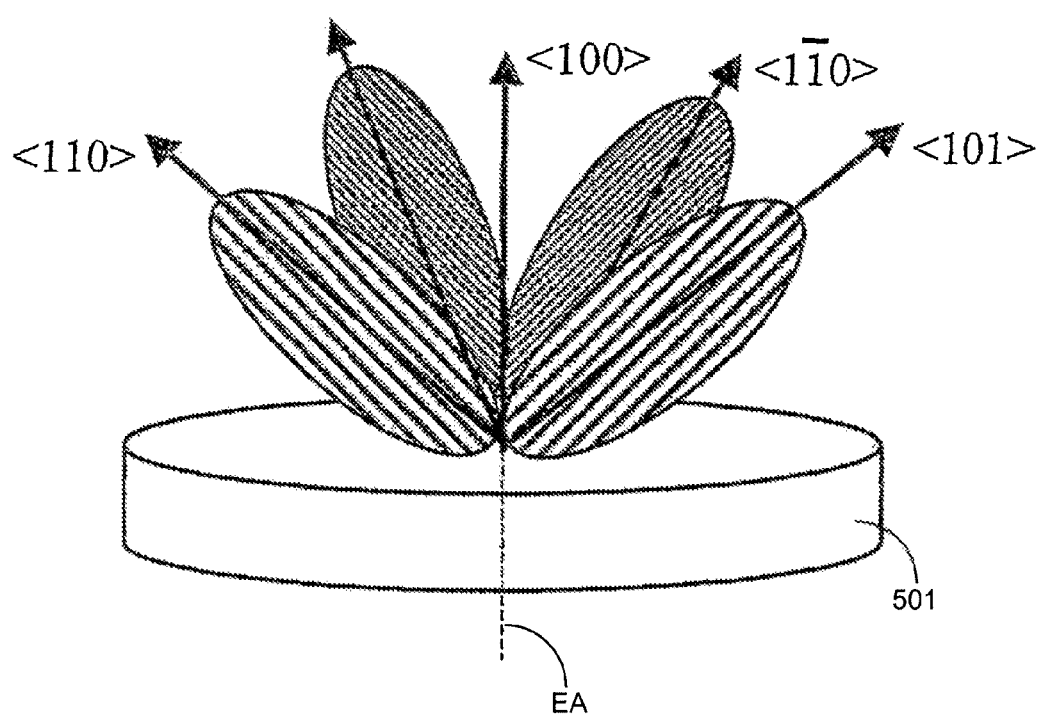
FIG. 5 shows a three-dimensional schematic representation that serves to visualize the dependence of the intrinsic birefringence on the crystallographic direction in a calcium fluoride lens in a (100)-section of the crystal.

FIG. 5 in a three-dimensional representation illustrates for comparison how the intrinsic birefringence in the calcium fluoride crystal material depends on the crystallographic direction in the case where the optical axis is oriented in the crystallographic <100>-direction. The drawing shows a circular planar-parallel plate 501 of calcium fluoride with its optical axis oriented in the crystallographic <100>-direction. Besides the crystallographic <100>-direction, the crystallographic directions <101>-, <1$\overline{1}$0>-, <10$\overline{1}$>- and <110> are likewise indicated by arrows. The intrinsic birefringence is represented schematically by four paddles whose surface areas indicate the amount of the intrinsic birefringence for the respective ray direction of a light ray. As is apparent from the diagram, the maximum amount of intrinsic birefringence occurs in the <110>-direction as well as in the crystallographic directions that are equivalent to the <110>-direction. Consequently, in a calcium fluoride lens cut with a crystallographic <100>-orientation, i.e. in a lens where the optical axis is parallel to the crystallographic <100>-direction, a maximum will occur at a ray angle of 45° relative to the optical axis.

Again with reference to the projection objective 100 of FIG. 1, and as is apparent from Table 3, for the ray that originates from the optical axis (YOB=0) the maximum absolute value of deviation from the "ideal" 45° ray angle that occurs in the meniscus lenses 123, 131 and 137 is about 5.1°. For the two aforementioned rays that originate from the border of the object field (YOB=28.0), the maximum absolute value of deviation from the "ideal" 45° ray angle that occurs in the meniscus lenses 123, 131 and 137 is about 7.7°.

As can further be seen in Table 3, the total path length traveled in the meniscus lenses 123, 131 and 137 by the aforementioned ray that originates from the optical axis (YOB=0) is 228.22 mm, i.e. about 9.9 times as large as the path length of 23.05 mm traveled by this ray in the last lens 138.

For the two aforementioned rays which originate from a point at the border of the object field (YOB=28.0) the total path length traveled in the meniscus lenses 123, 131 and 137 is 221.64 mm (for the ray that traverses the last lens 138 at an angle of +45°) and 230.30 mm (for the ray that traverses the last lens 138 at an angle of −45°) which is, respectively for the two rays, about 11.9 times as large and 8.5 times as large as the path length traveled by the same rays in the last lens 138.

As has already been discussed, in order to achieve the best possible match between the ray angles in the lens to be compensated (which in the case of FIG. 1 is lens 138) and the ray angles in the lenses that serve for the compensation, a factor of particular importance is to set the principal ray at an appropriate angle which (because of the telecentricity on the image-plane side) is small at the location of the last lens which is to be compensated in regard to intrinsic birefringence, and thus should likewise be small at the location of the lenses that serve for the compensation (which in the example of FIG. 1 are the lenses 123, 131 and 137). In the projection objective 100, the principal ray angle is 4.4° at the location of the intermediate image IMI. The principal ray angle is smaller than 10° in all of the $CaF_2$ lenses, in the lens 137 less than 6°, and in the lens 131 less than 2°.

FIGS. 4a and 4b represent the retardation in the projection objective 100 of FIG. 1 taking the intrinsic birefringence into account only in the last lens 138 on the image-plane side for a bundle of rays originating from the center of the object field (FIG. 4a) and for a bundle of rays originating from the border of the object field (FIG. 4b). The retardation (in nanometers) is shown as a function of the product of the refractive index of the immersion medium and the sine of the ray angle in x- and y-direction.

Figure 4E:
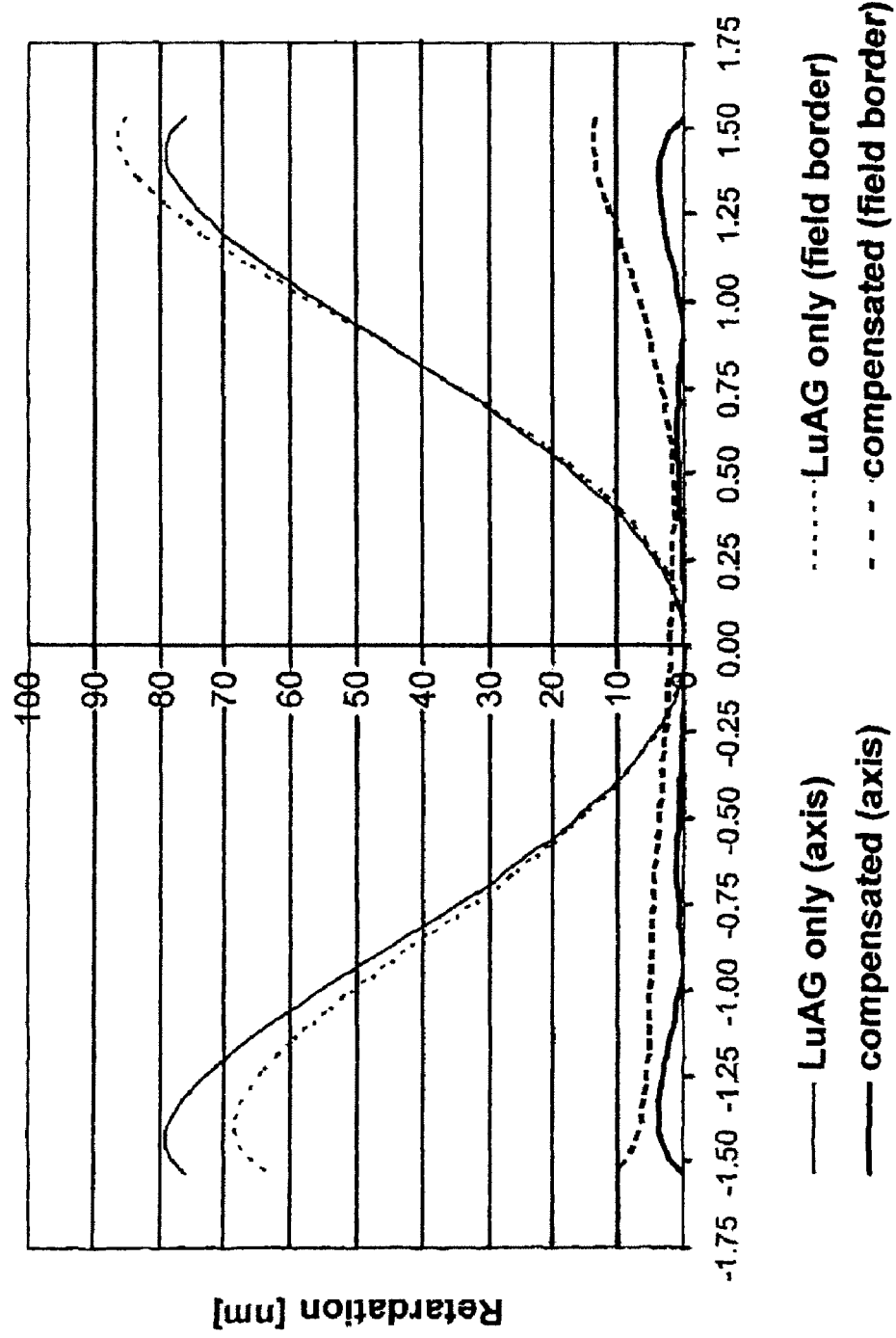

FIGS. 4c and 4d show for comparison the resultant retardation in the projection objective 100 of FIG. 1 taking into account the compensation of intrinsic birefringence in accordance with the disclosure for a bundle of rays originating from the center of the object field (FIG. 4c) and for a bundle of rays originating from the border of the object field (FIG. 4d). FIG. 4e shows a comparison between the respective retardations with and without compensation in a 45°-section.

In the projection objective 100, the last lens 138 on the image-plane side causes for a ray that originates from the optical axis (YOB=0) a retardation of 79.1 nm due to intrinsic birefringence, which is compensated by the $CaF_2$ lenses 123, 131 and 137 to such an extent that the still remaining retardation due to intrinsic birefringence caused in this ray by the entire projection objective 100 is only 4.2 nm. For a ray that originates from a point at the border of the object field (YOB=28.0), the last lens 138 on the image-plane side causes a retardation of 86.8 nm due to intrinsic birefringence, which is compensated by the $CaF_2$ lenses 123, 131 and 137 to such an extent that the still remaining retardation due to intrinsic birefringence caused in this ray by the entire projection objective 100 is only 14.6 nm.

Figure 2:
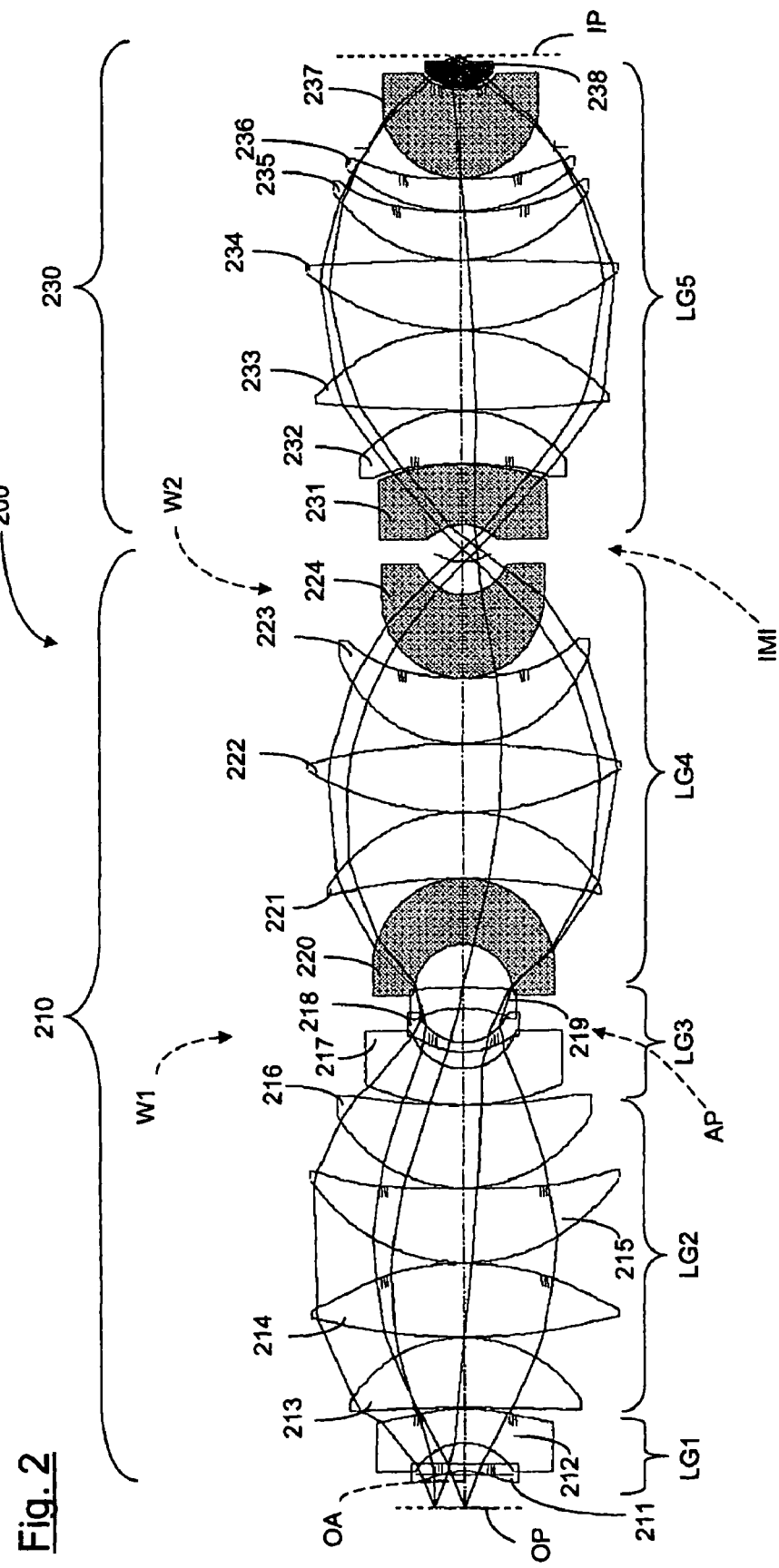
FIG. 2 represents a meridional section of a complete projection objective of a purely refractive design.

FIG. 2 illustrates a projection objective. The design data of this projection objective 200 are listed in Table 4 in a format analogous to Table 1, with the radii and thicknesses given again in millimeters (mm). The surfaces which are marked in FIG. 2 by short horizontal lines and specifically referred to in Table 5 are aspherically curved, wherein the curvature of these surfaces is described by the formula (4) for aspheres given hereinabove.

The projection objective 200 again in a purely refractive design, has a first optical subsystem 210 and a second optical subsystem 230.

The first optical subsystem 210 includes, in sequence along the optical axis OA, a first negative lens group LG1 of lenses 211 and 212, a second positive lens group LG2 of lenses 213-216, and a third negative lens group LG3 of lenses 217, 218 and 219. The third lens group LG3 contains a first waist W1 of the projection objective 200. AP corresponds to the aperture stop.

The first subsystem 210 includes further along the optical axis OA a fourth positive lens group LG4 of lenses 220-224, behind which an intermediate image IMI is produced. The intermediate image IMI is projected by the second optical subsystem 230 (with a fifth lens group LG5) which includes the lenses 231-238 into the image plane IP. When the system is operating in immersion mode, the space between the light exit surface of the last lens 238 and the light-sensitive coating which is arranged in the image plane IP is occupied by an immersion liquid (not shown in the drawing), cyclohexane in the present example.

Analogous to the projection objective 100 of FIG. 1, the last lens 238 on the image-plane side in the projection objective 200 of FIG. 2 is likewise made of lutetium aluminum garnet ($Lu_3Al_5O_{12}$). However, in contrast to the projection objective 100, the projection objective 200 has four lenses of calcium fluoride ($CaF_2$, again in <100>-oriented cut), because in addition to the meniscus lenses 224, 231 and 237, the first meniscus lens 220 which is located near the first waist W1 is also made of calcium fluoride ($CaF_2$). The rest of the lenses of the projection objective 200 are made of amorphous quartz ($SiO_2$).

In the design configuration shown in FIG. 2, the entirety of the four $CaF_2$ lenses, i.e. 220, 224, 231 and 237, substantially provides via polarization optics a compensation of the retardation caused by intrinsic birefringence in the last lens 238 on the image-plane side which is made of lutetium aluminum garnet ($Lu_3Al_5O_{12}$). As a consequence of arranging the meniscus lens 220 near the first waist W1 (and thus also in the area of large ray angles), it was possible in the projection objective 200 to reduce the thickness of the rest of the meniscus lenses made of $CaF_2$, i.e. 224, 231 and 237, in comparison to the projection objective 100 (see Table 4).

Table 6 lists for the selected rays as already defined in the context of Table 3 the respective ray angles at the locations of the four $CaF_2$ lenses 220, 224, 231 and 237 and at the location of the last lens 238 on the image-plane side, which is made of lutetium aluminum garnet ($Lu_3Al_5O_{12}$) as well as the path lengths inside these lenses.

As is apparent from Table 6, for the ray that originates from the optical axis (YOB=0) and traverses the last lens 238 at an angle of 45°, the maximum absolute value of deviation from the "ideal" 45° ray angle that occurs in the $CaF_2$ lenses 220, 224, 231 and 237 is about 6.1°. For the two rays that originate from the border of the object field (YOB=28.0), the maximum absolute value of deviation from the "ideal" 45° ray angle that occurs in the $CaF_2$ lenses 220, 224, 231 and 237 is about 8.8°.

As can further be seen in Table 6, the total path length traveled in the $CaF_2$ lenses 220, 224, 231 and 237 by the ray that originates from the optical axis (YOB=0) is 231.90 mm, i.e. about 9.9 times as large as the path length of 23.24 mm traveled by this ray in the last lens 238.

For the two aforementioned rays which originate from a point at the border of the object field (YOB=28.0) the total path length traveled in the $CaF_2$ lenses 220, 224, 231 and 237 is 214.67 mm (for the ray that traverses the last lens 238 at an angle of +45°) and 247.77 mm (for the ray that traverses the last lens 238 at an angle of −45°) which is, respectively for the two rays, about 11.4 times as large and 9.1 times as large as the path length traveled by the same rays in the last lens 238.

In the projection objective 200, the principal ray angle is 5.2° at the location of the intermediate image IMI.

Figure 3:
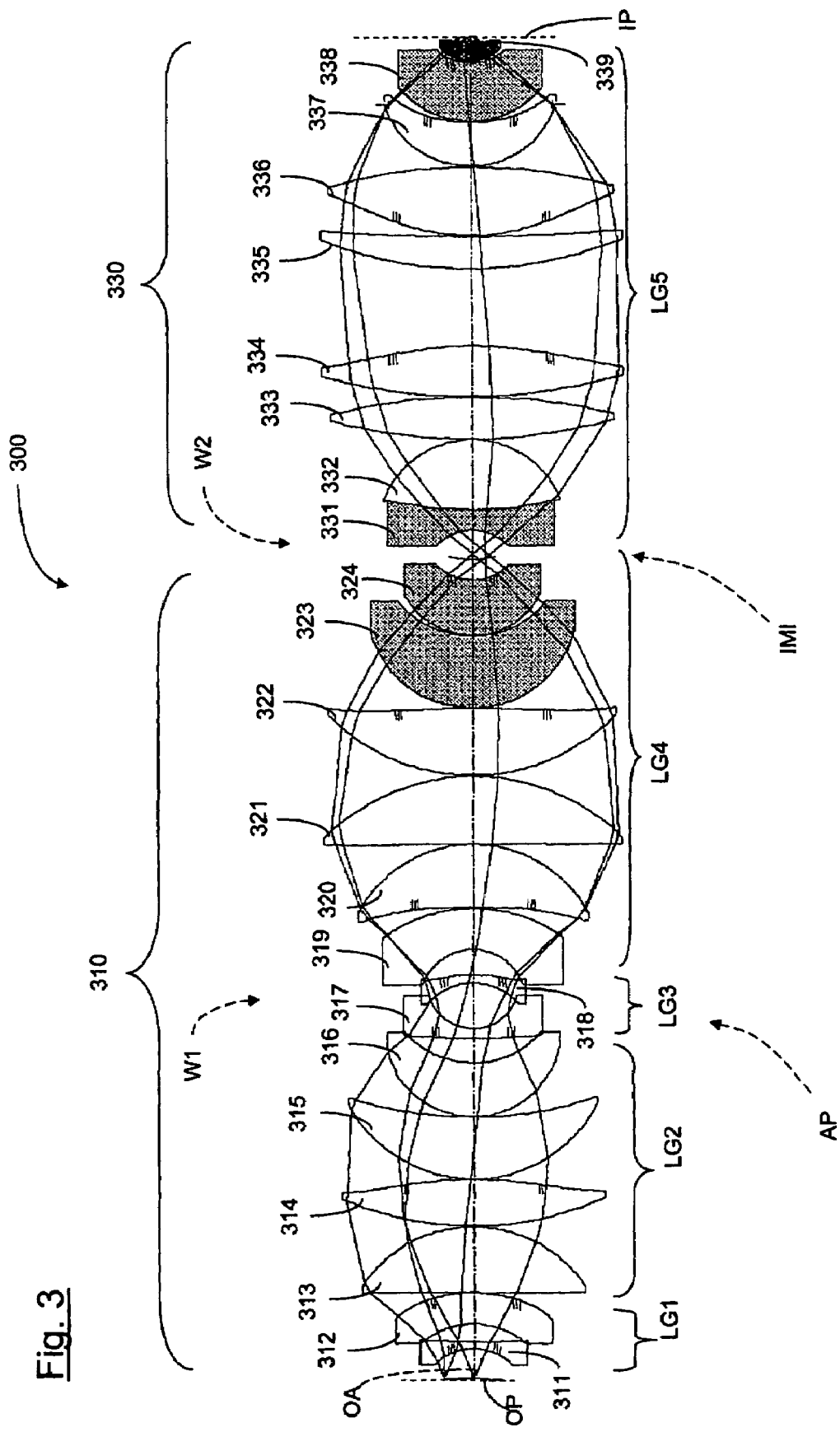
FIG. 3 represents a meridional section of a complete projection objective of a purely refractive design.

FIG. 3 illustrates a projection objective 300. The design data of this projection objective 300 are listed in Table 7 in a format analogous to Table 1 and Table 4, with the radii and thicknesses given again in millimeters (mm). The surfaces which are marked in FIG. 3 by short horizontal lines and specifically referred to in Table 8 are aspherically curved, with the curvature of these surfaces being described by the formula (4) for aspheres given hereinabove.

The projection objective 300 again in a purely refractive design, has a first optical sub-system 310 and a second optical subsystem 330.

The first optical subsystem 310 includes, in sequence along the optical axis OA, a first negative lens group LG1 of lenses 311 and 312, a second positive lens group LG2 of lenses 313-316, and a third negative lens group LG3 of lenses 317 and 318. The third lens group LG3 contains a first waist W1 of the projection objective 300. The first sub-system 310 includes further along the optical axis OA a fourth positive lens group LG4 of lenses 319-324, behind which an intermediate image IMI is produced. AP corresponds to the aperture stop.

The intermediate image IMI is projected by the second optical subsystem 330 (with a fifth lens group LG5) which includes the lenses 331-339 into the image plane IP. When the system is operating in immersion mode, the space between the light exit surface of the last lens 339 and the light-sensitive coating which is arranged in the image plane IP is again occupied by an immersion liquid (not shown in the drawing), cyclohexane in the present example.

Analogous to the projection objectives 100 and 200, the last lens 339 on the image-plane side in the projection objective 300 is likewise made of lutetium aluminum garnet ($Lu_3Al_5O_{12}$). Like the projection objective 200, the projection objective 300 has four calcium fluoride lenses 323, 324, 331 and 338 serving to compensate the retardation caused by the last lens 339 as a result of intrinsic birefringence (wherein instead of a $CaF_2$ lens in the area of the first waist W1, there is in this case a further $CaF_2$ lens in the area of the intermediate image IMI). In contrast to the projection objective 200, the lens 331 in the projection objective 300, which is arranged near the intermediate image IMI is connected to the next following lens 332 without a separating air gap (for example by wringing). Consequently, the lens 331 can be designed as a negative lens without thereby causing total reflection, which has a positive effect on the profile of path lengths over the field. According to an alternative design, the lens 331 which is arranged near the intermediate image IMI can also be separated from the lens 332 which follows next along the optical axis OA by a thin gap that is filled with a liquid of a high refractive index, for example cyclohexane.

Table 9 lists for the selected rays as already defined in the context of Table 3 the respective ray angles at the locations of the four $CaF_2$ lenses 323, 324, 331 and 338 and at the location of the last lens 339 on the image-plane side, which is made of lutetium aluminum garnet ($Lu_3Al_5O_{12}$) as well as the path lengths inside these lenses.

As is apparent from Table 9, for the ray that originates from the optical axis (YOB=0) and traverses the last lens 339 at an angle of 45°, the maximum absolute value of deviation from the "ideal" 45° ray angle that occurs in the $CaF_2$ lenses 323, 324, 331 and 338 is about 6.2°. For the two rays that originate from the border of the object field (YOB=28.0), the maximum absolute value of deviation from the "ideal" 45° ray angle that occurs in the $CaF_2$ lenses 323, 324, 331 and 338 is about 7.7°.

As can further be seen in Table 9, the total path length traveled in the $CaF_2$ lenses 323, 324, 331 and 338 by the ray that originates from the optical axis (YOB=0) is 189.27 mm, i.e. about 9.6 times as large as the path length of 19.61 mm traveled by this ray in the last lens 339.

For the two aforementioned rays which originate from a point at the border of the object field (YOB=28.0) the total path length traveled in the $CaF_2$ lenses 323, 324, 331 and 338 is 221.07 mm (for the ray that traverses the last lens 339 at an angle of +45°) and 166.53 mm (for the ray that traverses the last lens 339 at an angle of −45°) which is, respectively for the two rays, about 9.5 times as large and 10.8 times as large as the path length traveled by the same rays in the last lens 339.

In the projection objective 300, the principal ray angle is 0.6° at the location of the intermediate image IMI. The principal ray angle in all $CaF_2$ lenses is less than 6°, and in the lenses 323 and 331 less than 5°.

Figure 6:
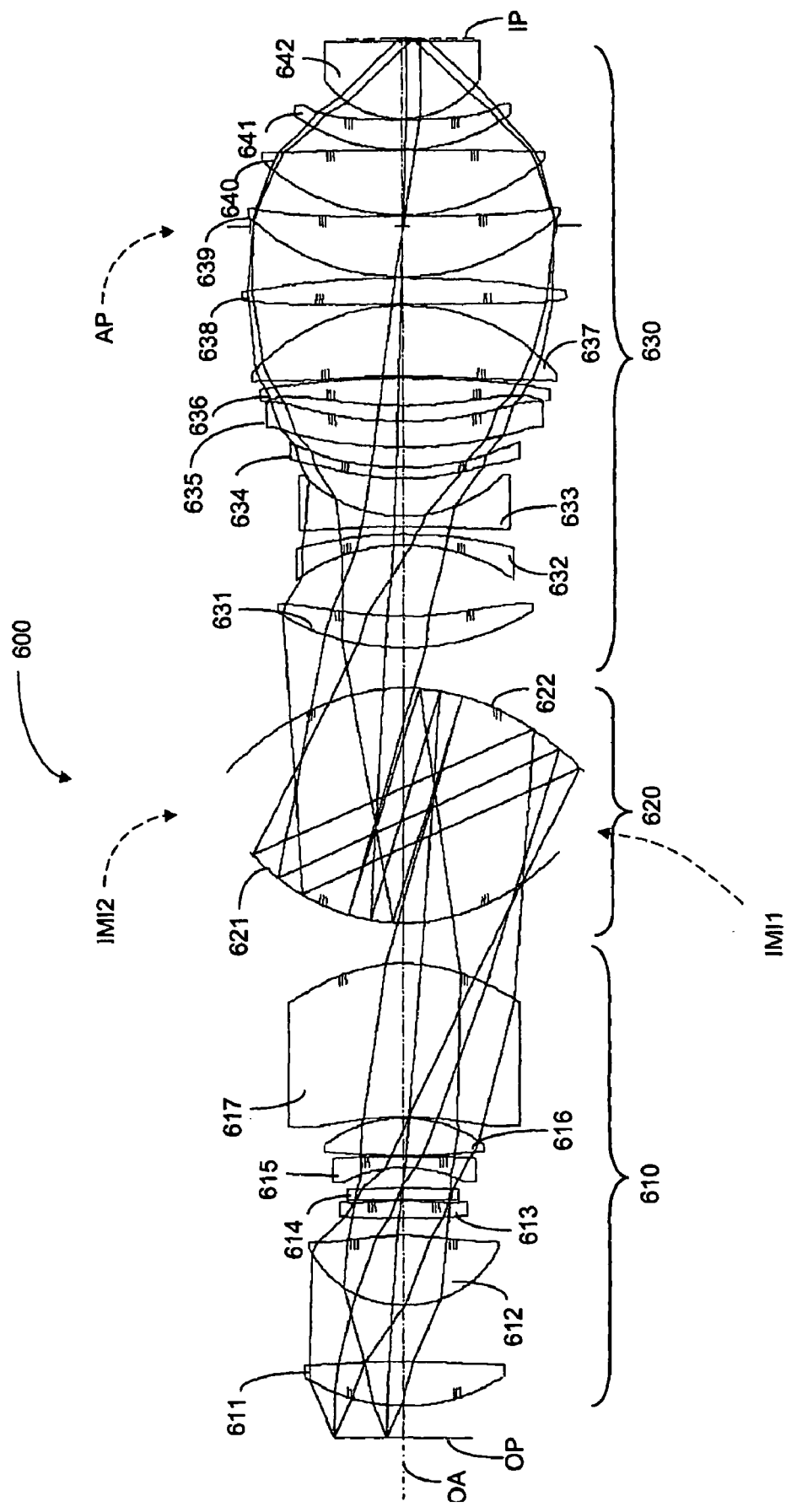
FIG. 6 represents a meridional section of a complete projection objective of a catadioptric design.

FIG. 6 illustrates a projection objective 600. The design data of this projection objective 600 are listed in Table 10 in a format analogous to Table 1, 4 and 7, with the radii and thicknesses given again in millimeters (mm). The surfaces which are marked in FIG. 6 by short horizontal lines and specifically referred to in Table 11 are aspherically curved, with the curvature of these surfaces being described by the formula (4) for aspheres given hereinabove.

The projection objective 600 of FIG. 6, in a catadioptric design, has a first optical sub-system 610, a second optical subsystem 620, and a third optical subsystem 630.

The first optical subsystem 610 includes an arrangement of refractive lenses 611-617. The first optical subsystem 610 projects the object plane "OP" into a first intermediate image IMI1, whose approximate length is indicated by an arrow in FIG. 6.

This first intermediate image IMI1 is projected by the second optical subsystem 620 into an intermediate image IMI2, whose approximate length is likewise indicated by an arrow in FIG. 6. The second optical subsystem 620 includes a first concave mirror 621 and a second concave mirror 622, both of which are cut off perpendicular to the optical axis so as to permit the light to propagate from the reflective surfaces of the concave mirrors 621, 622 to the image plane IP.

The second intermediate image IMI2 is projected by the third optical subsystem 630 into the image plane IP. The third optical subsystem 630 includes an arrangement of refractive lenses 631-642. An immersion liquid (not shown in the drawing), in this example cyclohexane, is present between the light exit surface of the last lens 642 and the light-sensitive coating that is disposed in the image plane IP. AP corresponds to the aperture stop.

In the projection objective 600 of FIG. 6, the last lens 642 on the image-plane side is made of lutetium aluminum garnet ($Lu_3Al_5O_{12}$) of a crystallographic <100>-cut. The first lens 631 of the third optical subsystem 630, i.e. the lens that follows the second optical subsystem 620, is likewise made of lutetium aluminum garnet ($Lu_3Al_5O_{12}$) of a crystallographic <100>-cut. The meniscus lens 617 which represents the last lens of the first optical subsystem 610 and thus the lens that is arranged immediately ahead of the second optical subsystem 620, is made of calcium fluoride ($CaF_2$), likewise of a crystallographic <100>-cut. The rest of the lenses of the projection objective 600 are made of amorphous quartz ($SiO_2$).

Figure 7:
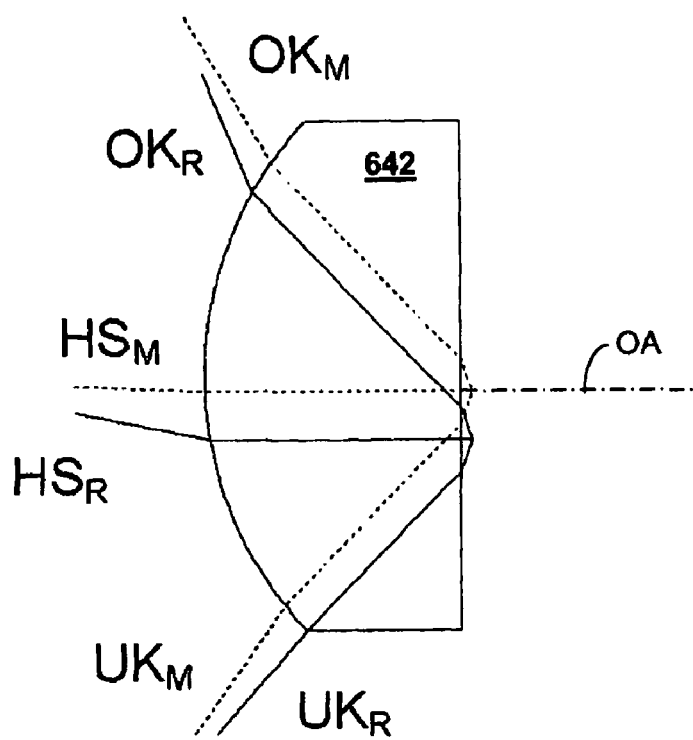
FIG. 7 shows a schematic view of typical travel paths of the principal ray as well as the upper and lower coma rays in a last lens on the image-plane side of the projection objective of FIG. 6.
Figure 8:
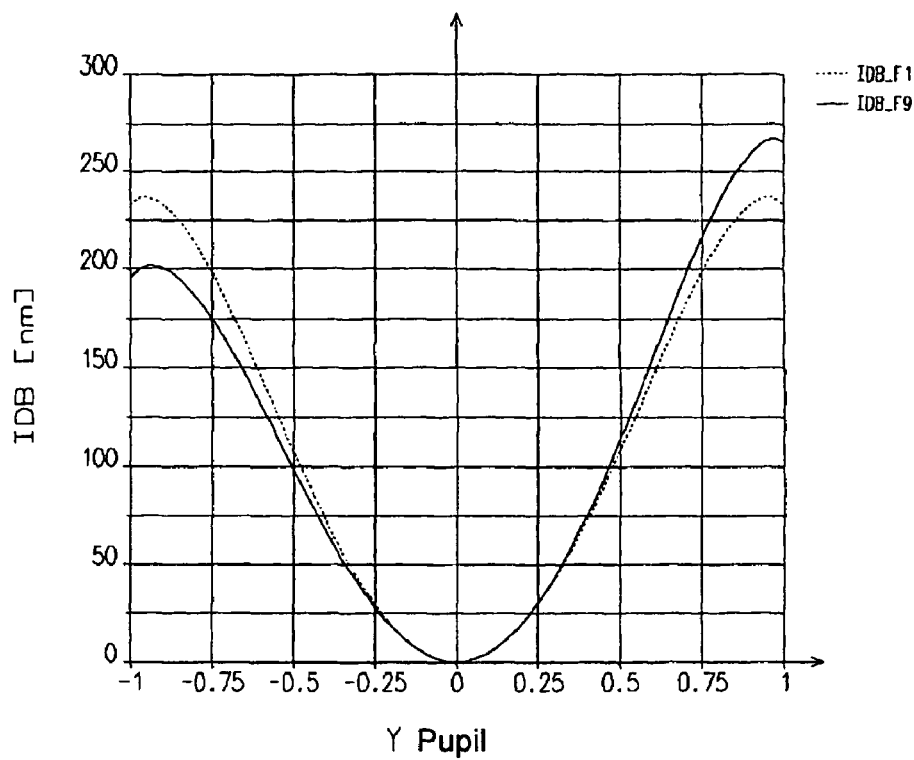
FIG. 8 illustrates the retardation caused by intrinsic birefringence (FIG. 8a) for the center of the field as well as for the border of the field, as well as the difference of the two retardations due to intrinsic birefringence for the center of the field and the border of the field (FIG. 8b) in the last lens on the image-plane side of the projection objective of FIG. 6.
Figure 8:
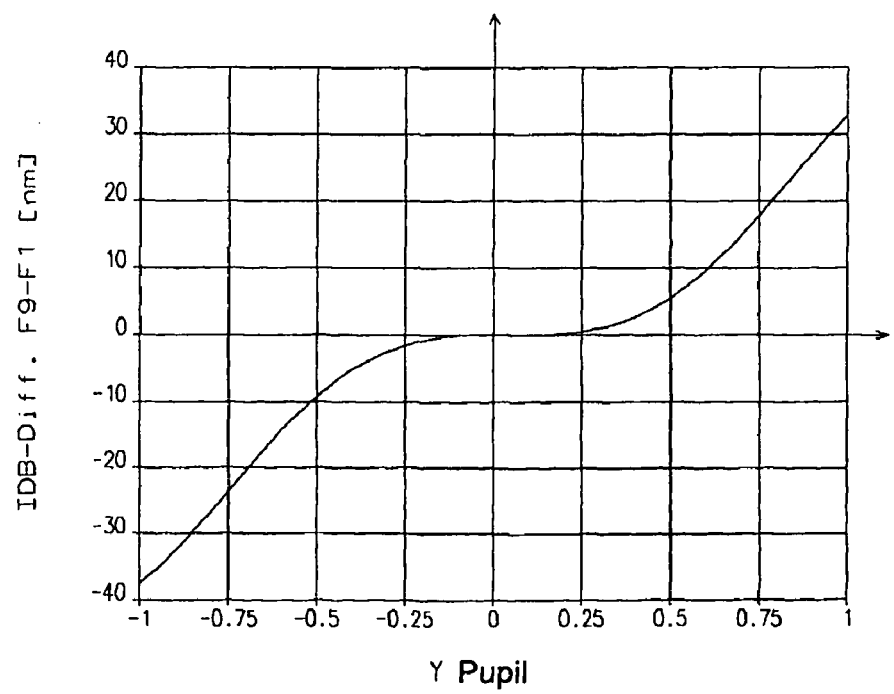

The projection objective 600 provides a solution for a further problem: because of the curved surface through which the light rays enter the last optical element 642 on the image-plane side, the light rays will have different optical path lengths depending on the angles and the locations at which these rays traverse the element 642, as shown schematically in FIG. 7. As is apparent from FIG. 8, this causes a variable field variation of the intrinsic birefringence (i.e., an amount of intrinsic birefringence that varies over the image field from the center to the border of the field).

FIG. 7 shows the typical paths traveled by the principal rays (HS) as well as the upper and lower coma rays (OK and UK) in a last lens 642 on the image-plane side. The principal ray that leads to the center of the field is identified as $HS_M$, and the principal ray that leads to the border of the field is identified as $HS_R$. The coma rays that lead to the center of the field are identified as $OK_M$ and $UK_M$, and the coma rays that lead to the border of the field are identified as $OK_R$ and $UK_R$. Of the rays that lead to the center of the field (represented by dotted lines in FIG. 7), the upper coma ray $OK_M$ and the lower coma ray $UK_M$ travel the same distance through the lens 642, while for those rays that lead to the border of the field (represented by solid lines in FIG. 7) the optical path lengths of the upper coma ray $OK_R$ and the lower coma ray $UK_R$ are different from each other. Thus, the upper coma ray $OK_R$ leading to the border of the field travels a longer distance in the material of the lens 642 than the upper coma ray $OK_M$ that travels to the center of the field, while the lower coma ray $UK_R$ leading to the border of the field travels a shorter distance than the lower coma ray $UK_M$ leading to the center of the field. As a consequence, the retardation of the pupil at the border of the field is "tilted", as is apparent from FIGS. 8a and 8b. FIG. 8a shows the retardation caused by birefringence in a meridional section in the last lens 642 on the image-plane side of the projection objective 600 for the middle of the field (dotted line) as well as for the border of the field (solid line). FIG. 8b shows the difference between the two retardations that are due to intrinsic birefringence for the center of the field and the border of the field.

In some embodiments, the projection objective 600 that is shown in FIG. 6 a further lens 631 of lutetium aluminum garnet ($Lu_3Al_5O_{12}$, LuAG) as well as a lens 617 of $CaF_2$ are set up in appropriate positions, so that the retardation in the lower coma ray $UK_R$ leading to the field border (which according to FIG. 7 travels a shorter distance in the last lens 642 than the upper coma ray $OK_R$ leading to the field border) is increased relative to the upper coma ray $OK_R$ leading to the field border. The aforementioned further LuAG lens 631 according to FIG. 6 is located, as seen in the travel direction of the light, immediately after the second subsystem 620 which is composed of the first concave mirror 621 and the second concave mirror 622, i.e. at a location where the lower coma ray $UK_R$ leading to the border of the field has a comparatively high ray angle and travels a longer distance through the lens than the upper coma ray $OK_R$. The aforementioned $CaF_2$ lens 617 is located immediately ahead of the mirror group 620, i.e. at a location where the lower coma ray leading to the border of the field has a comparatively low ray angle while the upper coma ray has a high ray angle. The compensation according to the disclosure is achieved in this case by the combination of the two lenses 617 and 631.

In general terms, the principle of the disclosure for the compensation of the field dependence of the intrinsic birefringence of the last lens on the image side can be described as follows: The material (and thus the algebraic sign of the intrinsic birefringence), the position, and the geometry of the additional lens or lenses used for the compensation of the field dependence are selected so that as a result a compensatory effect is achieved for the field dependence.

This means for example that whichever of the coma rays (upper or lower) travels the longer distance in the last lens which is to be compensated for intrinsic birefringence also travels the longer distance in the additional lens that is used for the compensation of the field dependence, if the additional lens has an intrinsic birefringence of the opposite algebraic sign in relation to the last lens on the image side. On the other hand, if the additional lens has an intrinsic birefringence of the same algebraic sign as the last lens on the image side, the geometry and the position for the additional lens which is used to compensate the field dependence serve as the way to ensure that whichever of the coma rays (upper or lower) travels the longer distance in the last lens which is to be compensated for intrinsic birefringence travels the shorter distance in the additional lens. Thus, if the intrinsic birefringence in the last lens on the image side has the same algebraic sign as in the additional lens that is used to compensate for the field dependence, the position for the additional lens is chosen in such a way, while taking its geometry into account, that the respective effects on the optical path lengths for the upper and lower coma ray are switched in the additional lens relative to the last lens on the image side.

A position for the additional lutetium aluminum garnet lens or lenses used for compensating the field dependence can in particular be in the proximity of a field plane, especially an intermediate image plane, because it is in this case most likely that different field points will have different conditions or different angles, so that the upper and lower coma ray will have different angles. As a quantitative criterion for a location to be considered close to an intermediate image, one may assume that the principal ray height of a border point relative to the object field is more than 50% of the lens radius at this location.

Figure 9:
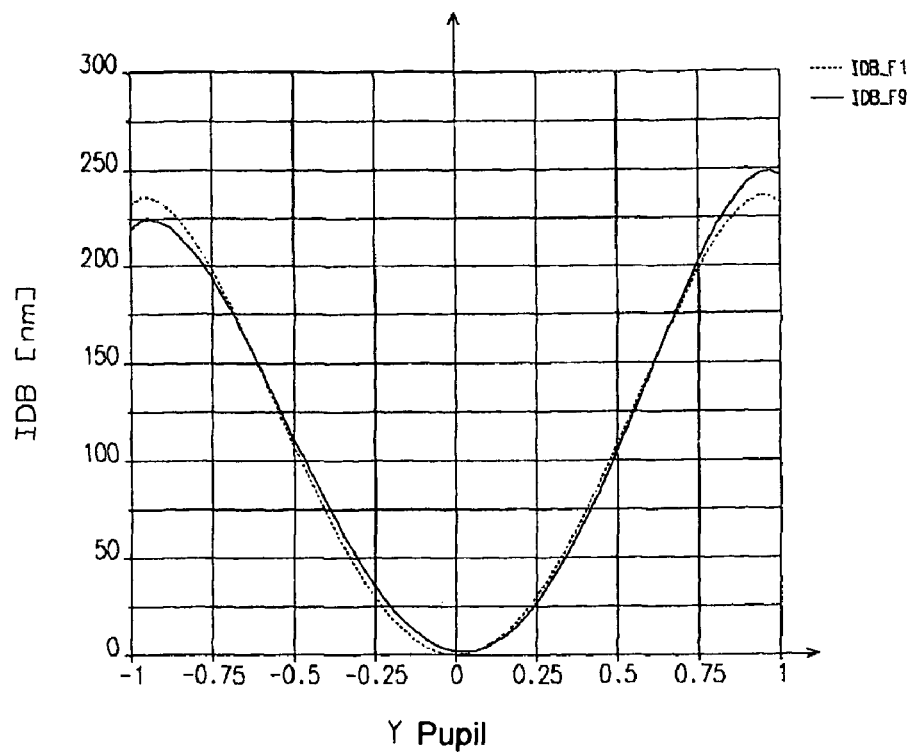
FIG. 9 illustrates for the entire projection objective of FIG. 6 the retardation caused by intrinsic birefringence (FIG. 9a) for the center of the field as well as for the border of the field, as well as the difference between the two retardations due to intrinsic birefringence for the center of the field and the border of the field (FIG. 9b)
Figure 9:
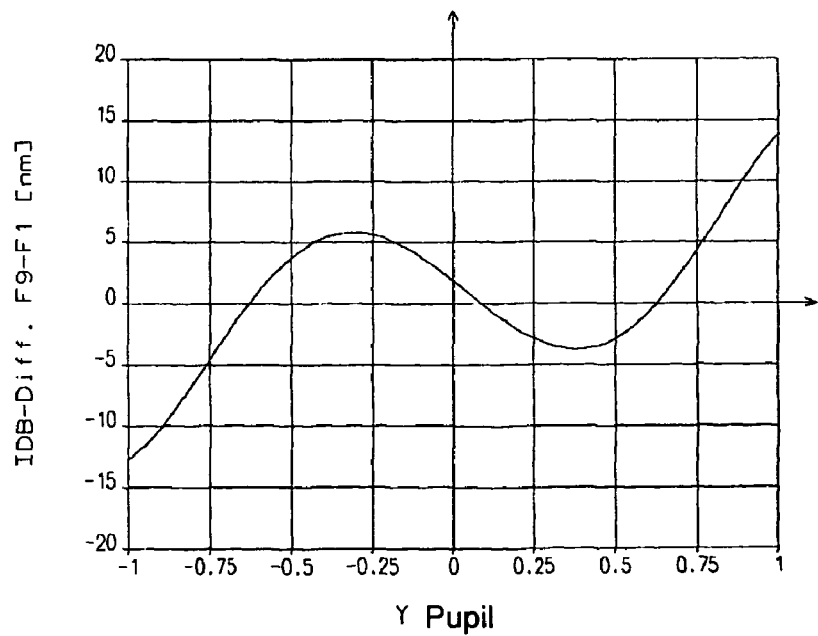

FIG. 9a shows for the entire projection objective 600 of FIG. 6 the retardation due to intrinsic birefringence for the center of the field (dotted line) as well as for the border of the field (solid line). FIG. 9b shows the difference of the two retardations due to intrinsic birefringence for the center of the field and the border of the field. By comparing the graphs of FIGS. 9b and 8b, it becomes apparent that over most of the area of the pupil there is a significant reduction in the difference between the retardations due to intrinsic birefringence for the center of the field and the border of the field.

The field dependence of the retardation due to intrinsic birefringence in the projection objective 600 is reduced by the combined effects of the two lenses 631 and 617. The remaining amount of intrinsic birefringence, which is substantially constant, can be further compensated by suitable measures (for example by using a Poincaréelement).

As has already been explained, the lens 631 in the foregoing example of FIG. 6 consists of the same material as the last lens on the image-plane side and is arranged in the light path in such a way that for the coma rays leading to the border of the field, the retardation for the ray which has the lesser retardation in the last lens 642 on the image-plane side (i.e. the ray $UK_R$ in FIG. 7) is increased relative to the other coma ray which has the larger retardation in the last lens 642 on the image-plane side (i.e. the ray $OK_R$ in FIG. 7), i.e. that the above-described field dependence is reduced. This principle for reducing the field dependence of the intrinsic birefringence is not limited to using the identical material in the additional lens 631; it is also possible to use another suitable material that is sufficiently transparent and has the same algebraic sign of the intrinsic birefringence (in the present example positive, as for LuAG). In the present case where the field dependence of the intrinsic birefringence is to be reduced in a LuAG lens, other suitable materials for the further lens that is used for compensation also include barium fluoride ($BaF_2$), $SrF_2$, MgO, Spinel, YAG, and $LiBaF_3$.

Figure 10:
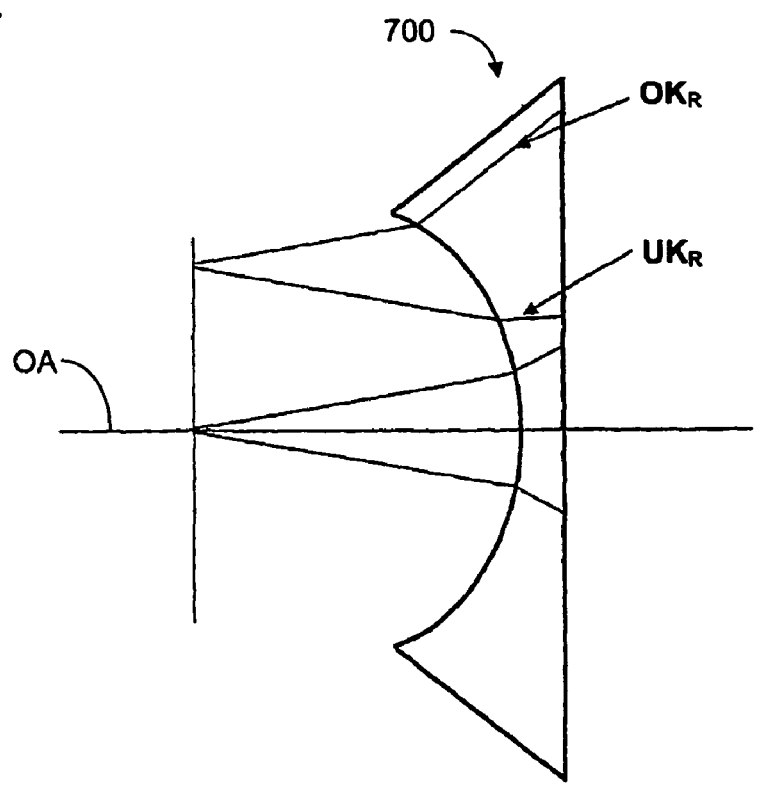
FIG. 10 schematically illustrates a lens that is used in a projection to compensate the intrinsic birefringence and at the same time reduce the field dependence of the intrinsic birefringence.

As has already been mentioned, the position of the additional lens or lenses used for compensating the field dependence needs to be selected appropriately. FIG. 10 schematically illustrates a lens 700 which is made of a material with intrinsic birefringence of the opposite algebraic sign (in this case $CaF_2$) in comparison to the compensating last lens (in this case LuAG) and which at the same time has a form and is set in a position suitable for reducing the field dependence of the intrinsic birefringence. The conditions illustrated in FIG. 7 are again used as the basis for the rays to be considered in the compensation of intrinsic birefringence in the last lens on the image-plane side. According to FIG. 10, the lens 700 of $CaF_2$ is arranged in the light path in such a way, taking its geometry into account, that the upper coma ray $OK_R$ that leads to the border of the field travels a relatively longer distance in the lens 700 than the lower coma ray $UK_R$ that leads to the border of the field. The upper coma ray $OK_R$ that leads to the border of the field traverses the $CaF_2$ material of the lens 700 at a relatively large angle of about 45° relative to the optical axis OA. The lower coma ray $UK_R$ that leads to the border of the field traverses the $CaF_2$ material of the lens 700 at a relatively small angle of close to 0° relative to the optical axis OA. In the projection objective 600 of FIG. 6, a suitable place for providing such a large ray angle for the upper coma ray $OK_R$ that leads to the border of the field is located (in the direction of light propagation) for example immediately ahead of the second optical subsystem 620. It needs to be noted in general that in different catadioptric systems, depending on their design, number of mirrors, etc. the suitable positions will be different and furthermore subject to a suitable selection that takes the geometry of the lens into account.

Thus, the $CaF_2$ lens 700 with a configuration as illustrated schematically in FIG. 10 has the result of compensating the intrinsic birefringence produced in the last lens 642 on the image-plane side and in addition has a field dependence of the retardation which at least partially compensates the last lens 642 on the image-plane side for the field dependence that was explained in the context of FIG. 7.

The principle explained through FIG. 10, whereby the field dependence of the intrinsic birefringence is reduced with the same lens that is also used for compensating the intrinsic birefringence itself, is likewise not limited to the material combination of $CaF_2$ and LuAG described above. Rather, the last lens on the image-plane side can also be made for example of yttrium aluminum garnet ($Y_3Al_5O_{12}$) or spinel, in particular magnesium spinel ($MgAl_2O_4$). The lens 700 which is used to compensate the intrinsic birefringence and simultaneously reduce the field dependence can also be made of a suitable material other than $CaF_2$, for example CaO.

Figure 11:
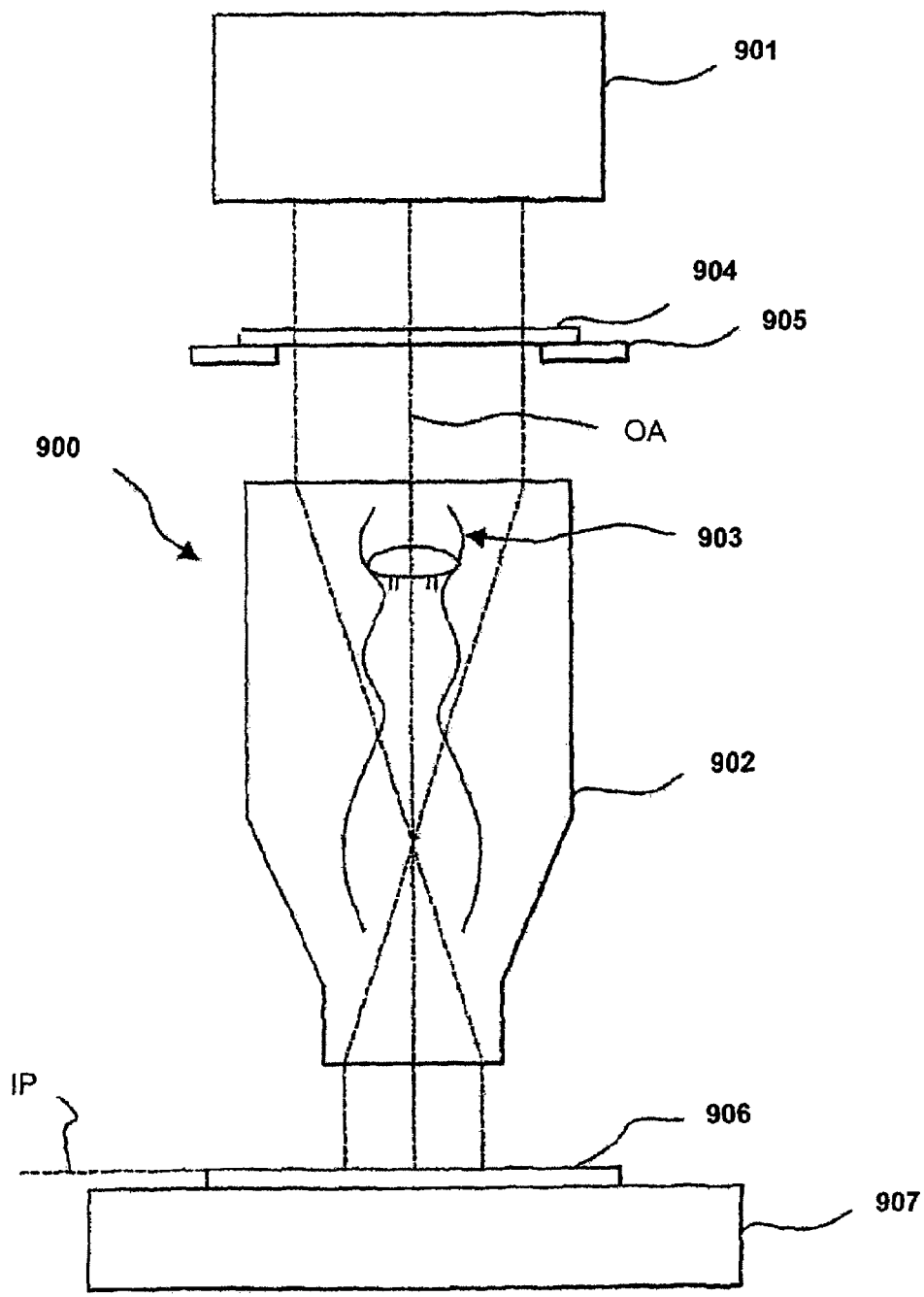
FIG. 11 schematically illustrates the overall design structure of a microlithographic projection exposure apparatus.

FIG. 11 schematically illustrates the overall layout of a microlithographic projection exposure apparatus.

A projection exposure apparatus 900 as shown in FIG. 11 has an illumination device 901 and a projection objective 902. The projection objective 902 includes a lens arrangement 903 outlined only schematically, which defines an optical axis OA. A mask 904 which is held in the light path via a mask holder 905 is arranged between the illumination device 901 and the projection objective 902. The mask 904 carries a structure in the micrometer- to nanometer range which is projected via the projection objective 902 onto an image plane IP, reduced for example by a factor of 4 or 5. A light-sensitive substrate 906 or wafer whose position is defined by a substrate holder 907 is held in the image plane IP.

Even though the disclosure has been described through the presentation of specific embodiments, those skilled in the pertinent art will recognize numerous possibilities for variations and alternative embodiments, for example by combining and/or exchanging features of individual embodiments. Accordingly, it will be understood that such variations and alternative embodiments are considered as being included in the present disclosure and that the scope of the disclosure is limited only by the attached patent claims and their equivalents.

TABLE 1

(Design Data for FIG. 1):
(NA = 1.55; projection ratio: 0.25;
image field diameter: 14 mm; wavelength 193 nm;
track length 1300 mm)

| SURFACE | RADIUS | THICKNESS | MATERIAL | REFR. INDEX | HALF-DIAMETER |
|---|---|---|---|---|---|
| 0 | infinity | 32.96681 | | | 28.040 |
| 1 | −56.63502 | 6.34267 | SIO2 | 1.560295 | 38.459 |
| 2 | −265.87372 | 19.21603 | | | 41.901 |
| 3 | −43.01197 | 32.08511 | SIO2 | 1.560295 | 40.043 |
| 4 | −120.11396 | 1.00000 | | | 76.539 |
| 5 | −2432.79187 | 66.52569 | SIO2 | 1.560295 | 101.782 |
| 6 | −129.73484 | 1.00000 | | | 108.592 |
| 7 | 455.20172 | 59.23416 | SIO2 | 1.560295 | 139.051 |
| 8 | −289.51826 | 1.00000 | | | 139.996 |
| 9 | 164.49278 | 83.35493 | SIO2 | 1.560295 | 139.854 |
| 10 | 2268.68962 | 1.00000 | | | 135.375 |
| 11 | 104.84962 | 38.08775 | SIO2 | 1.560295 | 92.735 |
| 12 | 135.99853 | 28.52856 | | | 82.104 |
| 13 | 328.22248 | 44.33427 | SIO2 | 1.560295 | 78.073 |
| 14 | 46.43960 | 36.54297 | | | 41.600 |
| 15 | −91.12323 | 11.78705 | SIO2 | 1.560295 | 41.614 |
| 16 | 802.28375 | 39.27922 | | | 46.053 |
| 17 | −48.91929 | 45.03635 | SIO2 | 1.560295 | 46.980 |
| 18 | −87.79776 | 1.00000 | | | 78.764 |
| 19 | −240.85571 | 52.43985 | SIO2 | 1.560295 | 102.730 |
| 20 | −124.63432 | 1.00000 | | | 109.831 |
| 21 | 518.28713 | 63.23559 | SIO2 | 1.560295 | 139.929 |
| 22 | −305.89219 | 1.00000 | | | 140.918 |
| 23 | 196.20918 | 62.30303 | SIO2 | 1.560295 | 129.751 |
| 24 | −591.20769 | 1.00000 | | | 126.272 |
| 25 | 88.41973 | 98.95527 | CAF2 | 1.501440 | 84.570 |
| 26 | 43.77458 | 25.15785 | | | 32.917 |
| intermediate image | 124.60032 | 23.43262 | | | 17.219 |
| 28 | −54.59901 | 99.58607 | CAF2 | 1.501440 | 31.774 |
| 29 | −101.46038 | 1.00000 | | | 89.424 |
| 30 | −346.40190 | 48.79351 | SIO2 | 1.560295 | 115.704 |
| 31 | −151.21181 | 1.00000 | | | 120.753 |
| 32 | 21778.29238 | 46.10283 | SIO2 | 1.560295 | 139.324 |
| 33 | −291.80758 | 1.00000 | | | 141.051 |
| 34 | 239.02892 | 58.55251 | SIO2 | 1.560295 | 140.210 |
| 35 | −2654.26746 | 1.00000 | | | 137.805 |
| 36 | 125.69801 | 47.62358 | SIO2 | 1.560295 | 110.775 |
| 37 | 353.50358 | 1.00000 | | | 105.653 |
| 38 | 117.08829 | 19.22373 | SIO2 | 1.560295 | 87.178 |
| 39 | 141.59714 | 23.19201 | | | 81.132 |
| aperture stop | infinity | −23.69486 | | | 84.803 |
| 41 | 80.76353 | 71.11529 | CAF2 | 1.501440 | 70.800 |
| 42 | 55.35607 | 1.00000 | | | 30.579 |
| 43 | 38.96692 | 23.96612 | LUAG | 2.14 | 27.768 |
| 44 | infinity | 3.00000 | cyclohexane | 1.65 | 14.929 |
| 45 | infinity | 0.00000 | | | 7.011 |

TABLE 2

(Aspherical Constants for FIG. 1):

| | Surface | | | | |
|---|---|---|---|---|---|
| | 1 | 4 | 8 | 13 | 24 |
| K | 0 | 0 | 0 | 0 | 0 |
| C1 | 2.645602E−06 | 3.847265E−07 | −3.941142E−09 | −3.229421E−07 | 5.642888E−08 |
| C2 | 1.502930E−10 | 1.989874E−12 | 2.562027E−12 | 3.705748E−11 | −1.514421E−12 |
| C3 | −4.915987E−14 | −9.765487E−15 | −9.801037E−17 | −3.384228E−15 | 4.853726E−19 |

TABLE 2-continued (Aspherical Constants for FIG. 1):

| | | | | | |
|---|---|---|---|---|---|
| C4 | 1.140562E−16 | 1.787779E−18 | 3.738791E−21 | 4.610381E−20 | 4.669938E−21 |
| C5 | −3.813147E−20 | −9.390821E−23 | −1.641228E−25 | 1.744559E−23 | −3.074593E−25 |
| C6 | 1.788217E−23 | 1.118686E−27 | 3.082126E−30 | −1.227588E−27 | 6.424146E−30 |

| | Surface | | | |
|---|---|---|---|---|
| | 26 | 36 | 39 | 42 |
| K | 0 | 0 | 0 | 0 |
| C1 | −1.899680E−06 | −5.126862E−10 | 1.445153E−07 | 9.192307E−08 |
| C2 | −5.960797E−10 | −1.456247E−12 | −1.453535E−12 | −3.404920E−09 |
| C3 | 6.816419E−14 | −7.394307E−17 | −2.011575E−15 | 1.199131E−11 |
| C4 | −4.783825E−17 | −1.783805E−20 | 4.697112E−19 | −1.777134E−14 |
| C5 | −1.910674E−21 | 8.367900E−25 | −1.321783E−22 | 1.477279E−17 |
| C6 | −4.564990E−25 | −1.124856E−28 | 9.887052E−27 | −4.553703E−21 |

TABLE 3

(Ray Angles and Path Lengths of Selected Rays in FIG. 1):

| | YOB = 0 | | YOB = 28.0 | | | | | |
|---|---|---|---|---|---|---|---|---|
| Surface | Ray Angle | Path Length | Ray Angle | Path Length | Ray Angle | Path Length | Ray Angle | Path Length |
| 25 (CaF$_2$) | −40.45 | 82.32 | −46.19 | 71.35 | 9.21 | 97.31 | 37.29 | 89.24 |
| 28 (CaF$_2$) | −39.89 | 87.72 | −37.30 | 93.39 | −1.17 | 99.92 | 44.82 | 81.02 |
| 41 (CaF$_2$) | 46.61 | 58.19 | 44.39 | 56.90 | 5.70 | 71.88 | −49.81 | 60.04 |
| Sum CaF$_2$ | | 228.22 | | 221.64 | | 269.11 | | 230.30 |
| 43 (LuAG) | 45.00 | 23.05 | 45.00 | 18.51 | 0.00 | 23.33 | −45.00 | 26.94 |

TABLE 4

(Design Data for FIG. 2):
(NA = 1.55; projection ratio: 0.25;
image field diameter: 14 mm; wavelength 193 nm;
track length 1300 mm)

| SURFACE | RADIUS | THICKNESS | MATERIAL | REFR. INDEX | HALF-DIAMETER |
|---|---|---|---|---|---|
| 0 | infinity | 33.10640 | | | 28.040 |
| 1 | −64.53479 | 7.00097 | SIO2 | 1.560295 | 38.331 |
| 2 | 11410.06360 | 18.56583 | | | 44.409 |
| 3 | −52.51269 | 31.20276 | SIO2 | 1.560295 | 42.365 |
| 4 | −143.80696 | 0.73434 | | | 77.481 |
| 5 | −2776.57322 | 63.01390 | SIO2 | 1.560295 | 98.512 |
| 6 | −130.39213 | 0.50000 | | | 105.888 |
| 7 | 608.44380 | 65.12810 | SIO2 | 1.560295 | 136.588 |
| 8 | −252.60882 | 0.93801 | | | 138.185 |
| 9 | 176.63839 | 68.87016 | SIO2 | 1.560295 | 141.074 |
| 10 | −3118.18620 | 0.65902 | | | 135.853 |
| 11 | 145.25114 | 72.55844 | SIO2 | 1.560295 | 116.813 |
| 12 | 583.31951 | 0.50000 | | | 101.333 |
| 13 | 168.91222 | 32.37360 | SIO2 | 1.560295 | 84.259 |
| 14 | 50.80931 | 18.33667 | | | 46.653 |
| 15 | 95.42635 | 7.58176 | SIO2 | 1.560295 | 46.588 |
| 16 | 45.84176 | 31.82961 | | | 39.110 |
| 17 | −94.12075 | 18.23811 | SIO2 | 1.560295 | 39.217 |
| 18 | −312.33941 | 37.94847 | | | 44.801 |
| 19 | −46.95731 | 59.03250 | CAF2 | 1.501440 | 46.200 |
| 20 | −84.91596 | 0.50000 | | | 82.875 |
| 21 | −497.25663 | 58.82516 | SIO2 | 1.560295 | 119.371 |
| 22 | −152.25080 | 0.50000 | | | 124.182 |
| 23 | 289.85450 | 61.77474 | SIO2 | 1.560295 | 141.040 |
| 24 | −638.44686 | 0.50000 | | | 140.106 |
| 25 | 122.85617 | 54.34526 | SIO2 | 1.560295 | 113.077 |
| 26 | 271.05847 | 0.50000 | | | 104.509 |
| 27 | 76.50520 | 75.63079 | CAF2 | 1.501440 | 76.392 |
| 28 | 45.36878 | 29.67076 | | | 39.308 |
| intermediate image | 49.27123 | 33.66560 | | | 22.925 |
| 30 | −45.05627 | 54.74904 | CAF2 | 1.501440 | 28.207 |

TABLE 4-continued (Design Data for FIG. 2):
(NA = 1.55; projection ratio: 0.25;
image field diameter: 14 mm; wavelength 193 nm;
track length 1300 mm)

| SURFACE | RADIUS | THICKNESS | MATERIAL | REFR. INDEX | HALF-DIAMETER |
|---|---|---|---|---|---|
| 31 | −201.28849 | 0.50000 | | | 72.535 |
| 32 | −543.05837 | 49.62678 | SIO2 | 1.560295 | 77.735 |
| 33 | −126.87576 | 0.54449 | | | 93.696 |
| 34 | 1495.56382 | 71.03985 | SIO2 | 1.560295 | 129.370 |
| 35 | −186.75185 | 0.68088 | | | 133.002 |
| 36 | 230.80495 | 61.23684 | SIO2 | 1.560295 | 140.416 |
| 37 | −2474.60195 | 0.65604 | | | 138.288 |
| 38 | 148.53793 | 38.78401 | SIO2 | 1.560295 | 115.043 |
| 39 | 258.85943 | 0.75767 | | | 108.838 |
| 40 | 162.15982 | 29.14598 | SIO2 | 1.560295 | 102.274 |
| 41 | 494.91877 | 28.59727 | | | 95.852 |
| aperture stop | infinity | −27.67099 | | | 85.718 |
| 43 | 74.96381 | 79.56335 | CAF2 | 1.501440 | 71.057 |
| 44 | 51.81008 | 1.00000 | | | 30.748 |
| 45 | 39.68640 | 24.00000 | LUAG | 2.14 | 27.890 |
| 46 | infinity | 3.00000 | cyclohexane | 1.65 | 14.859 |
| 47 | infinity | 0.00000 | | | 7.010 |

TABLE 5

(Aspherical Constants for FIG. 2):

| | \multicolumn{5}{c}{Surface} | | | | |
|---|---|---|---|---|---|

| | 1 | 4 | 8 | 10 | 15 |
|---|---|---|---|---|---|
| K | 0 | 0 | 0 | 0 | 0 |
| C1 | 1.763957E−06 | 3.755260E−07 | −4.379645E−08 | 1.101314E−07 | 4.531003E−07 |
| C2 | 3.634373E−11 | −1.406638E−12 | 4.191112E−12 | −8.179864E−12 | −2.351315E−11 |
| C3 | −9.994095E−14 | −7.515251E−15 | −1.779625E−16 | 6.285729E−16 | −3.059541E−14 |
| C4 | 1.584396E−16 | 1.475561E−18 | 5.848969E−21 | −3.254356E−20 | 1.704009E−18 |
| C5 | −9.335036E−20 | −1.540272E−22 | −6.855126E−26 | 9.075205E−25 | 4.170531E−21 |
| C6 | 2.044024E−23 | 7.241873E−27 | 5.133436E−32 | −1.035441E−29 | −6.217566E−24 |

| | 26 | 32 | 39 | 41 | 44 |
|---|---|---|---|---|---|
| K | 0 | 0 | 0 | 0 | 0 |
| C1 | 7.053218E−08 | −1.886461E−07 | −3.465416E−08 | 1.730955E−07 | −2.322052E−06 |
| C2 | 6.467165E−13 | 1.794881E−11 | −1.241655E−12 | −2.607682E−12 | 2.449955E−10 |
| C3 | 4.006622E−17 | −1.399918E−15 | 7.370701E−16 | −1.212575E−15 | 2.379722E−12 |
| C4 | 6.809150E−21 | −4.776965E−20 | −3.680185E−20 | 9.464394E−20 | −6.578933E−16 |
| C5 | −3.861729E−25 | 2.329283E−23 | 1.499527E−25 | −7.971558E−24 | −5.903603E−19 |
| C6 | 2.714521E−29 | −1.919958E−27 | 6.507375E−29 | 4.200950E−28 | 9.291284E−22 |

TABLE 6

(Ray Angles and Path Lengths of Selected Rays in FIG. 2):

| | YOB = 0 | | YOB = 28.0 | | | |
|---|---|---|---|---|---|---|
| Surface | Ray Angle | Path Length | Ray Angle | Path Length | Ray Angle | Path Length |
| 19 (CaF$_2$) | 44.48 | 51.20 | 49.59 | 48.94 | −13.56 | 59.13 | −37.53 | 54.24 |
| 27 (CaF$_2$) | −43.81 | 57.32 | −53.84 | 45.67 | 10.80 | 72.86 | 37.40 | 64.59 |
| 30 (CaF$_2$) | −38.86 | 65.18 | −37.87 | 63.83 | −1.44 | 56.02 | 41.35 | 68.57 |
| 43 (CaF$_2$) | 46.60 | 58.20 | 44.91 | 56.23 | 5.44 | 79.26 | −49.66 | 60.37 |
| Sum CaF$_2$ | | 231.90 | | 214.67 | | 267.28 | | 247.77 |
| 45 (LuAG) | 45.00 | 23.24 | 45.00 | 18.76 | 0.00 | 23.38 | −45.00 | 27.08 |

TABLE 7

(Design Data for FIG. 3):
(NA = 1.55; projection ratio: 0.25;
image field diameter: 14 mm; wavelength 193 nm;
track length 1300 mm)

| SURFACE | RADIUS | THICKNESS | MATERIAL | REFR. INDEX | HALF-DIAMETER |
|---|---|---|---|---|---|
| 0 | infinity | 30.00000 | | | 28.040 |
| 1 | −45.34661 | 6.63569 | SIO2 | 1.560295 | 34.955 |
| 2 | 1675.19781 | 17.13750 | | | 46.780 |
| 3 | −77.75289 | 30.58781 | SIO2 | 1.560295 | 47.328 |
| 4 | −124.23942 | 0.50000 | | | 72.405 |
| 5 | −73576.81777 | 63.76707 | SIO2 | 1.560295 | 99.917 |
| 6 | −128.44591 | 0.50000 | | | 105.072 |
| 7 | 316.69160 | 46.18746 | SIO2 | 1.560295 | 122.142 |
| 8 | −366.45888 | 0.50000 | | | 121.948 |
| 9 | 135.64958 | 59.65802 | SIO2 | 1.560295 | 117.501 |
| 10 | 370.97252 | 0.50000 | | | 112.645 |
| 11 | 84.77454 | 52.88605 | SIO2 | 1.560295 | 82.107 |
| 12 | 86.67486 | 24.35393 | | | 62.830 |
| 13 | 275.85279 | 9.33487 | SIO2 | 1.560295 | 62.225 |
| 14 | 44.31195 | 43.71929 | | | 40.705 |
| 15 | −58.35873 | 7.97126 | SIO2 | 1.560295 | 40.653 |
| 16 | −244.53229 | 25.02039 | | | 45.726 |
| 17 | −50.87339 | 39.63412 | SIO2 | 1.560295 | 45.954 |
| 18 | −145.76439 | 0.50000 | | | 83.061 |
| 19 | −2391.32638 | 61.40919 | SIO2 | 1.560295 | 101.246 |
| 20 | −125.17493 | 0.50000 | | | 108.748 |
| 21 | −24939.46308 | 64.76538 | SIO2 | 1.560295 | 137.528 |
| 22 | −204.66293 | 0.50000 | | | 140.232 |
| 23 | 192.59054 | 65.53129 | SIO2 | 1.560295 | 135.374 |
| 24 | −1084.22343 | 0.50000 | | | 132.125 |
| 25 | 102.23928 | 70.05238 | CAF2 | 1.501440 | 97.172 |
| 26 | 92.54515 | 0.50000 | | | 68.715 |
| 27 | 73.05020 | 53.81825 | CAF2 | 1.501440 | 63.193 |
| 28 | 46.67198 | 20.40954 | | | 31.298 |
| intermediate image | 113.66698 | 27.25464 | | | 18.622 |
| 30 | −47.24138 | 20.11458 | CAF2 | 1.501440 | 31.231 |
| 31 | 379.43421 | 67.61644 | SIO2 | 1.560295 | 76.186 |
| 32 | −91.55378 | 0.50000 | | | 83.083 |
| 33 | 509.79823 | 41.08552 | SIO2 | 1.560295 | 129.341 |
| 34 | −581.40593 | 0.50000 | | | 131.623 |
| 35 | 541.27683 | 48.42319 | SIO2 | 1.560295 | 140.217 |
| 36 | −307.24168 | 74.98915 | | | 140.755 |
| 37 | 388.58249 | 30.96250 | SIO2 | 1.560295 | 140.392 |
| 38 | 1880.14612 | 1.07110 | | | 139.024 |
| 39 | 199.86067 | 64.84583 | SIO2 | 1.560295 | 133.153 |
| 40 | −490.51044 | 0.50000 | | | 130.891 |
| 41 | 86.06198 | 43.06181 | SIO2 | 1.560295 | 81.180 |
| 42 | 156.57620 | 17.48034 | | | 73.632 |
| aperture stop | infinity | −16.75867 | | | 79.038 |
| 44 | 87.74949 | 57.50449 | CAF2 | 1.501440 | 65.909 |
| 45 | 47.66405 | 1.00000 | | | 28.299 |
| 46 | 38.51830 | 19.94611 | LUAG | 2.14 | 25.391 |
| 47 | infinity | 3.00000 | Cyclohexane | 1.65 | 14.678 |
| 48 | infinity | 0.00000 | | | 7.030 |

TABLE 8

(Aspherical Constants for FIG. 3):

| | Surface | | | | | |
|---|---|---|---|---|---|---|
| | 1 | 4 | 8 | 13 | 16 | 19 |
| K | 0 | 0 | 0 | 0 | 0 | 0 |
| C1 | 2.299566E−06 | 2.405693E−07 | 3.397605E−09 | −7.055224E−07 | −9.673460E−07 | −1.935833E−07 |
| C2 | −3.075082E−10 | −3.104016E−11 | 4.585626E−12 | 1.943685E−10 | 3.957326E−10 | 1.572216E−11 |
| C3 | 4.151037E−14 | −7.954078E−15 | −2.139393E−16 | −3.674762E−14 | −6.224268E−14 | −4.727436E−16 |
| C4 | 8.445864E−18 | 1.841880E−18 | 4.327678E−21 | 7.065863E−18 | 3.262662E−17 | −3.123005E−20 |
| C5 | 2.806177E−21 | −1.867774E−22 | −6.597045E−26 | −1.063948E−21 | 3.244042E−21 | 3.506619E−24 |
| C6 | −4.635668E−24 | 4.148300E−27 | 2.545630E−30 | 7.411306E−26 | 1.949424E−25 | −1.054006E−28 |

TABLE 8-continued (Aspherical Constants for FIG. 3):

| | Surface | | | | | |
|---|---|---|---|---|---|---|
| | 24 | 28 | 36 | 39 | 42 | 45 |
| K  | 0 | 0 | 0 | 0 | 0 | 0 |
| C1 | 2.338736E−08 | 3.338459E−07 | 4.992819E−08 | −7.938669E−09 | 2.440562E−07 | −4.511854E−06 |
| C2 | −9.169558E−13 | −2.246250E−10 | −1.039966E−12 | −1.577246E−12 | −2.510122E−11 | 7.165705E−09 |
| C3 | 1.623701E−16 | −2.607890E−13 | 1.685598E−17 | −3.499386E−17 | 4.220529E−15 | −1.885912E−11 |
| C4 | −1.131470E−20 | −6.224977E−17 | −5.069299E−22 | 2.442885E−22 | −7.398058E−19 | 3.519990E−14 |
| C5 | 3.968698E−25 | −2.624016E−21 | 2.767963E−26 | 8.204097E−27 | 1.073813E−23 | −3.028376E−17 |
| C6 | −5.510296E−30 | −7.885389E−25 | −3.198605E−31 | 1.439082E−30 | 6.073682E−27 | 1.073894E−20 |

TABLE 9

(Ray Angles and Path Lengths of Selected Rays in FIG. 3):

| | YOB = 0 | | YOB = 28.0 | | | | | |
|---|---|---|---|---|---|---|---|---|
| Surface | Ray Angle | Path Length | Ray Angle | Path Length | Ray Angle | Path Length | Ray Angle | Path Length |
| 25 (CaF$_2$) | −38.81 | 49.94 | −37.40 | 54.19 | 4.84 | 69.23 | 42.61 | 42.31 |
| 27 (CaF$_2$) | −41.88 | 47.97 | −39.90 | 51.15 | 5.90 | 53.57 | 46.67 | 43.62 |
| 30 (CaF$_2$) | −41.71 | 37.80 | −48.83 | 60.04 | −4.74 | 22.12 | 37.32 | 28.39 |
| 44 (CaF$_2$) | 47.63 | 53.56 | 51.76 | 55.69 | 5.50 | 58.24 | −45.22 | 52.21 |
| Sum CaF$_2$ | | 189.27 | | 221.07 | | 203.16 | | 166.53 |
| 46 (LuAG) | 45.00 | 19.61 | 45.00 | 23.13 | 0.00 | 19.30 | −45.00 | 15.41 |

TABLE 10

(Design Data for FIG. 6):
(NA = 1.55; projection ratio: 0.25;
object-side field radius 63.7 mm; wavelength 193 nm;
track length 1290 mm)

| SURFACE | RADIUS | THICKNESS | MATERIAL | REFR. INDEX | HALF-DIAMETER |
|---|---|---|---|---|---|
| 0 | infinity | 29.992828 | | | 63.700 |
| 1 | 175.999452 | 40.590889 | SIO2 | 1.5607857 | 86.436 |
| 2 | −1560.238043 | 52.594561 | | | 86.535 |
| 3 | 97.243272 | 65.572103 | SIO2 | 1.5607857 | 84.428 |
| 4 | −294.775166 | 16.455975 | | | 79.239 |
| 5 | 1285.871896 | 15.613735 | SIO2 | 1.5607857 | 53.533 |
| 6 | −364.362861 | 1.365097 | | | 46.616 |
| 7 | infinity | 9.999161 | SIO2 | 1.5607857 | 44.671 |
| 8 | infinity | 19.324565 | | | 45.639 |
| 9 | −125.039669 | 9.999421 | SIO2 | 1.5607857 | 50.363 |
| 10 | −5816.016537 | 1.028348 | | | 60.173 |
| 11 | 667.986129 | 34.613825 | SIO2 | 1.5607857 | 64.765 |
| 12 | −121.074022 | 0.998408 | | | 68.833 |
| 13 | −353.046557 | 140.747015 | CAF2 | 1.50185255 | 72.791 |
| 14 | −158.371650 | 254.733735 | | | 101.264 |
| 15 | −185.982261 | −217.236509 | REFL | | 160.005 |
| 16 | 174.954384 | 254.735842 | REFL | | 138.467 |
| 17 | 222.388922 | 29.383236 | LUAG | 2.14 | 111.888 |
| 18 | 328.114561 | 64.670833 | | | 109.220 |
| 19 | −180.235715 | 10.000212 | SIO2 | 1.5607857 | 94.243 |
| 20 | −390.257697 | 6.471036 | | | 93.985 |
| 21 | −1800.751074 | 10.000070 | SIO2 | 1.5607857 | 91.491 |
| 22 | 130.948652 | 33.968401 | | | 87.685 |
| 23 | 192.799727 | 10.319857 | SIO2 | 1.5607857 | 96.871 |
| 24 | 244.505452 | 18.972606 | | | 100.234 |
| 25 | 396.224936 | 24.072617 | SIO2 | 1.5607857 | 113.757 |
| 26 | 416.506260 | 14.570609 | | | 121.300 |
| 27 | 385.486480 | 24.645384 | SIO2 | 1.5607857 | 122.844 |
| 28 | −886.666327 | 1.750563 | | | 127.210 |
| 29 | −913.170822 | 65.306426 | SIO2 | 1.5607857 | 131.747 |
| 30 | −185.524638 | 0.998678 | | | 135.817 |
| 31 | 5322.765583 | 24.681761 | SIO2 | 1.5607857 | 142.415 |
| 32 | −834.144782 | 0.998005 | | | 142.486 |
| 33 | 208.400294 | 56.019771 | SIO2 | 1.5607857 | 138.237 |

TABLE 10-continued (Design Data for FIG. 6):
(NA = 1.55; projection ratio: 0.25;
object-side field radius 63.7 mm; wavelength 193 nm;
track length 1290 mm)

| SURFACE | RADIUS | THICKNESS | MATERIAL | REFR. INDEX | HALF-DIAMETER |
|---|---|---|---|---|---|
| 34 | −3702.463966 | −9.295436 | | | 135.859 |
| aperture stop | infinity | 10.293382 | | | 139.812 |
| 36 | 190.872739 | 58.682969 | SIO2 | 1.5607857 | 125.410 |
| 37 | 3949.758825 | 0.991606 | | | 120.921 |
| 38 | 169.174143 | 27.348968 | SIO2 | 1.5607857 | 94.021 |
| 39 | 1012.494365 | 0.983178 | | | 86.151 |
| 40 | 89.894671 | 69.937516 | LUAG | 2.14 | 66.797 |
| 41 | infinity | 3.100000 | Cyclohexane | 1.65 | 24.484 |
| image | infinity | 0.000000 | Cyclohexane | 1.65 | 15.927 |

TABLE 11

(Aspherical Constants for FIG. 6):

| | Surface | | | | |
|---|---|---|---|---|---|
| | 1 | 4 | 6 | 10 | 14 |
| K | 0 | 0 | 0 | 0 | 0 |
| C1 | 6.761085E−08 | 6.321466E−08 | 1.842427E−07 | −4.620035E−08 | 1.489414E−08 |
| C2 | −8.934154E−12 | 1.063850E−11 | 2.603365E−11 | −2.708712E−12 | 9.171296E−13 |
| C3 | 6.296333E−16 | 4.886554E−16 | 1.087931E−14 | −3.627942E−16 | 3.658370E−17 |
| C4 | −3.563175E−20 | −2.163040E−19 | −4.175363E−18 | −2.996829E−20 | 3.624361E−21 |
| C5 | 1.028565E−24 | 1.294346E−23 | 1.778256E−21 | 1.200506E−23 | −1.121019E−25 |
| C6 | −1.914229E−30 | −1.874983E−28 | −2.320966E−26 | −1.848620E−27 | 1.207088E−29 |

| | Surface | | | | |
|---|---|---|---|---|---|
| | 15 | 16 | 18 | 19 | 23 |
| K | −2.06123 | −1.58139 | 0 | 0 | 0 |
| C1 | −2.853518E−08 | 2.915108E−08 | −4.471709E−08 | 5.093200E−08 | −9.443607E−08 |
| C2 | 2.729835E−13 | 3.354095E−14 | −1.110913E−12 | −1.186049E−11 | −2.496777E−12 |
| C3 | −6.062602E−18 | 3.536672E−18 | 5.108435E−19 | 4.015165E−16 | −2.493114E−16 |
| C4 | 1.004775E−22 | 1.072190E−23 | 2.404960E−21 | −5.477694E−21 | 2.877121E−20 |
| C5 | −1.485589E−27 | 3.244050E−28 | −8.830192E−26 | 3.813615E−24 | −1.273222E−24 |
| C6 | 8.077859E−33 | 1.222099E−32 | 4.852066E−31 | −2.199896E−28 | 1.945399E−28 |

| | Surface | | | | |
|---|---|---|---|---|---|
| | 26 | 27 | 29 | 31 | 34 |
| K | 0 | 0 | 0 | 0 | 0 |
| C1 | 7.369590E−08 | −3.275058E−08 | 7.694568E−09 | −1.081284E−08 | 3.012090E−08 |
| C2 | −5.076154E−12 | −1.141252E−12 | 8.996680E−13 | 6.517487E−13 | 7.966369E−14 |
| C3 | −2.379682E−16 | −1.662263E−16 | 1.077820E−16 | −9.657998E−18 | −4.257609E−17 |
| C4 | 2.981736E−20 | 1.483186E−20 | −6.476483E−21 | 1.918377E−22 | 1.276846E−21 |
| C5 | −1.093304E−24 | −6.063410E−25 | −1.330566E−25 | 7.441252E−26 | 3.674302E−26 |
| C6 | 5.969424E−30 | 5.218568E−30 | 5.794927E−30 | −2.603441E−30 | −1.495166E−30 |

| | Surface | |
|---|---|---|
| | 37 | 39 |
| K | 0 | 0 |
| C1 | −4.968391E−08 | 1.154059E−07 |
| C2 | 3.197982E−12 | 5.300232E−14 |
| C3 | −2.451376E−17 | 1.766029E−16 |
| C4 | −6.124383E−21 | 2.428535E−20 |
| C5 | 2.869368E−25 | −1.517820E−24 |
| C6 | −3.662522E−30 | 2.394969E−28 |

What is claimed is:

1. A projection objective, comprising:
at least one lens which as a consequence of intrinsic birefringence causes a maximum retardation of at least 25 nm/cm,
wherein the projection objective has an optical compensation of a polarization such that a retardation which is caused by the projection objective is less than 0.25 times as large as the operating wavelength of the projection objective, and the projection objective is configured to be used in a microlithographic projection exposure apparatus, and
wherein:
the projection objective is configured to project an image of a mask that can be set in position in an object plane onto a light-sensitive coating layer that can be set in position in an image plane;
the projection objective is configured to operate in an immersion mode,
the projection objective is configured to produce at least one intermediate image and comprises an optical subsystem on the image-plane side which projects the intermediate image into the image plane with an image-plane-side projection ratio $\beta_i$, wherein $\beta_i = NA_{IMI}/NA_{IP}$, wherein $NA_{IMI}$ represents the numerical aperture at the location of the intermediate image and $NA_{IP}$ represents the numerical aperture on the image-plane side,
the image-plane-side projection ratio $\beta_i$ has an absolute value of at least 0.3; and
the projection objective is of a purely refractive design.

2. The projection objective according to claim 1, wherein the image-plane-side projection ratio $\beta_i$ satisfies the condition $0.3 \leq \beta_i \leq 1.2$.

3. The projection objective according to claim 1, wherein the projection objective comprises a next-to-last optical element on the image-plane side, the next-to-last optical element comprising a fluoride crystal material.

4. The projection objective according to claim 1, wherein the projection objective has an optical axis, an angle between a principal ray and the optical axis at a location of the intermediate image is smaller than 10°.

5. The projection objective according to claim 1, wherein the projection objective has an optical axis, and the projection objective comprises a plurality of lenses comprising a fluoride crystal material.

6. The projection objective according to claim 5, wherein an angle between a principal ray and the optical axis at a location of at least one of the lenses is smaller than 10°.

7. The projection objective according to claim 5, wherein at least one of the lenses comprises a crystal cut orientation such that the optical axis is substantially parallel to a crystallographic <100>-direction of the at least one of the lenses.

8. The projection objective according to claim 5, wherein at least one of the lenses comprises a crystal cut orientation such that the optical axis is substantially parallel to a crystallographic <111>-direction of the at least one of the lenses.

9. The projection objective according to claim 1, wherein the projection objective comprises at least two crystal lenses whose respective retardations due to intrinsic birefringence have opposite algebraic signs.

10. The projection objective according to claim 1, wherein:
the projection objective comprises:
a last optical element on the image-plane side; and
at least one further optical element, whose position, geometry and material are selected so that an optical path difference which exists between an upper and a lower coma ray in the last optical element on the image-plane side is at least partially compensated by the further optical element.

11. The projection objective according to claim 10, wherein the further optical element is arranged at least close to a field plane.

12. The projection objective according to claim 10, wherein the further optical element and the last optical element on the image-plane side, respectively, cause retardations due to intrinsic birefringence which have opposite algebraic signs.

13. The projection objective according to claim 10, wherein the further optical element and the last optical element on the image-plane side, respectively, cause retardations due to intrinsic birefringence which have the same algebraic sign.

14. The projection objective according to claim 10, wherein the further optical element comprises a fluoride crystal material.

15. The projection objective according to claim 1, wherein the projection objective comprises a last optical element on the image-plane side having a refractive index $n_{LL}$ larger than 1.6 at an operating wavelength of the projection objective.

16. The projection objective according to claim 15, wherein the last optical element on the image-plane side comprises a material selected from the group consisting of lutetium aluminum garnet ($Lu_3Al_5O_{12}$), yttrium aluminum garnet ($Y_3Al_5O_{12}$), lithium barium fluoride ($LiBaF_3$), and spinel.

17. The projection objective according to claim 1, wherein the projection objective comprises a last optical element on the image-plane side having a refractive index $n_{LL}$ larger than 1.7 for the operating wavelength of the projection objective.

18. The projection objective according to claim 17, wherein the last optical element on the image-plane side comprises a fluoride crystal material.

19. The projection objective according to claim 1, wherein the projection objective comprises a plurality of lenses, each of the plurality of lenses comprising a fluoride crystal material.

20. The projection objective according to claim 1, wherein the projection objective has an image-side numerical aperture of at least 1.0.

21. The projection objective according to claim 1, wherein an operating wavelength of the projection objective is less than 250 nm.

22. An apparatus, comprising:
an illumination device; and
a projection objective according to claim 1,
wherein the projection objective is a microlithographic projection exposure apparatus.

23. A method, comprising:
using a microlithographic projection exposure apparatus to manufacture of micro-structured components, wherein the microlithographic projection exposure apparatus comprises:
an illumination device; and
a projection objective according to claim 1.

24. The method according to claim 23, wherein the method comprises:
projecting at least a part of a mask onto an area of a light sensitive coating via the microlithographic projection exposure apparatus.

* * * * *

UNITED STATES PATENT AND TRADEMARK OFFICE
CERTIFICATE OF CORRECTION

PATENT NO.        : 7,710,640 B2
APPLICATION NO.   : 12/138851
DATED             : May 4, 2010
INVENTOR(S)       : Susanne Beder et al.

It is certified that error appears in the above-identified patent and that said Letters Patent is hereby corrected as shown below:

Column 6, Line 44, delete "$(|\Delta_1 * d_1)$" insert -- $(|\Delta_1| * d_1)$ --.

Column 8, Line 55, delete "117 119" insert -- 117-119 --.

Column 9, Line 51, delete "$<10\bar{1}_1>$-" insert -- $<10\bar{1}>$- --.

Column 15, Line 57, delete "Poincaréelement" insert -- Poincaré element --.

Signed and Sealed this

Seventh Day of September, 2010

David J. Kappos
*Director of the United States Patent and Trademark Office*